US012664338B2

(12) United States Patent (10) Patent No.: US 12,664,338 B2
Liu et al. (45) Date of Patent: Jun. 23, 2026

(54) DEEP LEARNING-ENABLED SYNTHESIS OF ELECTROMAGNETIC STRUCTURES

(71) Applicant: The Trustees of Princeton University, Princeton, NJ (US)

(72) Inventors: Zheng Liu, Monmouth Junction, NJ (US); Emir Ali Karahan, Princeton, NJ (US); Kaushik Sengupta, Princeton Junction, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 831 days.

(21) Appl. No.: 18/073,482

(22) Filed: Dec. 1, 2022

(65) Prior Publication Data

US 2023/0169241 A1 Jun. 1, 2023

Related U.S. Application Data

(60) Provisional application No. 63/284,704, filed on Dec. 1, 2021.

(51) Int. Cl.
*G06F 30/27* (2020.01)
*G06F 30/327* (2020.01)

(52) U.S. Cl.
CPC ............ *G06F 30/27* (2020.01); *G06F 30/327* (2020.01)

(58) Field of Classification Search
USPC ........................................................ 716/101
See application file for complete search history.

(56) References Cited

U.S. PATENT DOCUMENTS

2020/0133449 A1* 4/2020 Davies ................. G06F 3/0482
2020/0320380 A1* 10/2020 Cmielowski ............ G06N 3/09

OTHER PUBLICATIONS

Liu, Bo et al., "Synthesis of Integrated Passive Components for High-Frequency RF ICs Based on Evolutionary Computation and Machine Learning Techniques," IEEE Transactions on Computer-Aided Design of Integrated Circuits and Systems, vol. 30, No. 10, pp. 1458-1468, Oct. 2011.

(Continued)

*Primary Examiner* — Bryce M Aisaka
(74) *Attorney, Agent, or Firm* — Meagher Emanuel Laks Goldberg & Liao, LLP

(57) ABSTRACT

Various embodiments comprise systems, methods, mechanisms, apparatus, and improvements thereof providing a machine learning based inverse design method for electromagnetic structures by specifying an electromagnetic structure design goal including a target electromagnetic response; representing a physical structure of an electromagnetic structure as an array of pixels, wherein each pixel indicates the presence or absence of conductive material wherein the represented physical structure of the electromagnetic structure further includes one or more input ports on one edge of the array and one output port on another edge of the array; providing a neural network (NN) based electromagnetic (EM) emulator configured to predict scattering parameters of electromagnetic structures represented by the array of pixels over frequencies of interest; and optimizing, using the NN-based EM emulator, across a multi-dimensional design space of possible electromagnetic structure representations using evolution algorithms until an electromagnetic structure substantially satisfying the electromagnetic structure design goal is reached.

23 Claims, 14 Drawing Sheets

(56) References Cited

OTHER PUBLICATIONS

Molesky, Sean et al., "Inverse Design in Nanophotonics," Nature Photonics, vol. 12, pp. 659-670, Nov. 2018.

Shakib, Sherif et al., "A Wideband 28GHz Power Amplifier Supporting 8x100MHz Carrier Aggregation for 5G in 40nm CMOS,".

Buckwalter, J.F. et al., "Prospects for High-Efficiency Silicon and III-V Power Amplifiers and Transmitters in 100-300 GHz Bands," IEEE CICC, pp. 1-7, Jun. 2021.

Wang, Fei and Wang, Hua, "An Instantaneously Broadband Ultra-Compact Highly Linear PA with Compensated Distributed-Balun Output Network Achieving > 17.8dBm P1dB and >36.6% PAEP1dB over 24 to 40GHz and Continuously Supporting 64-/256-QAM 5G NR Signals Over 24-42GHz," ISSCC, pp. 372-374, Feb. 2020.

Vigilante, Marco and Reynaert, Patrick, "A Wideband Class-AB Power Amplifier with 29-57-GHz AM-PM Compensation in 0.9-V 28-nm Bulk CMOS," IEEE JSSC, vol. 53, No. 5, pp. 1288-1301, May 2018.

* cited by examiner $$Z_{in}=f(W_1,L_1,...W_N,L_N)$$

$\times$ Pre-decided non-optimal template $\times$ Time consuming parameter sweeps 1→metal; 0→no metal; $Z_{in}$=f(location of 0&1)

✓ Larger design space
✓ Deep Learning based EM emulator + evolution algorithm for fast optimization
✓ Approach global optimum

536μm

1367μm

700

800

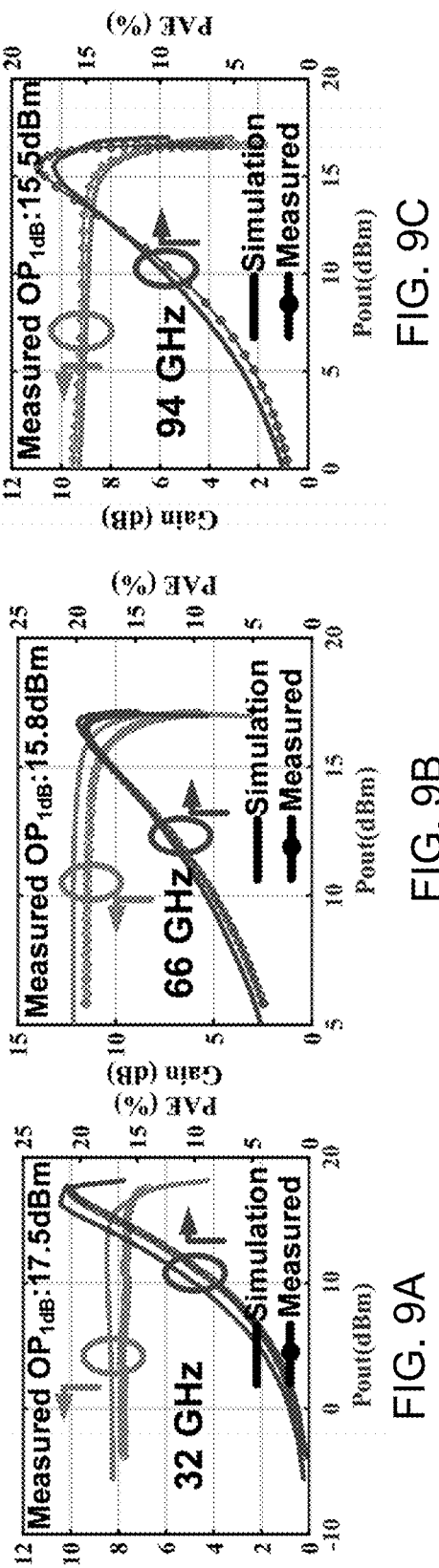
FIG. 9A
FIG. 9B
FIG. 9C
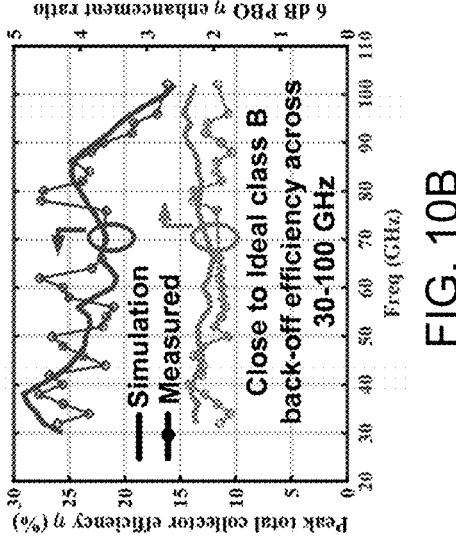
FIG. 10B
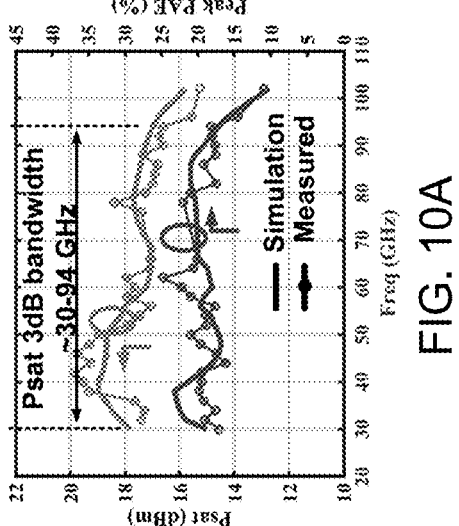
FIG. 10A

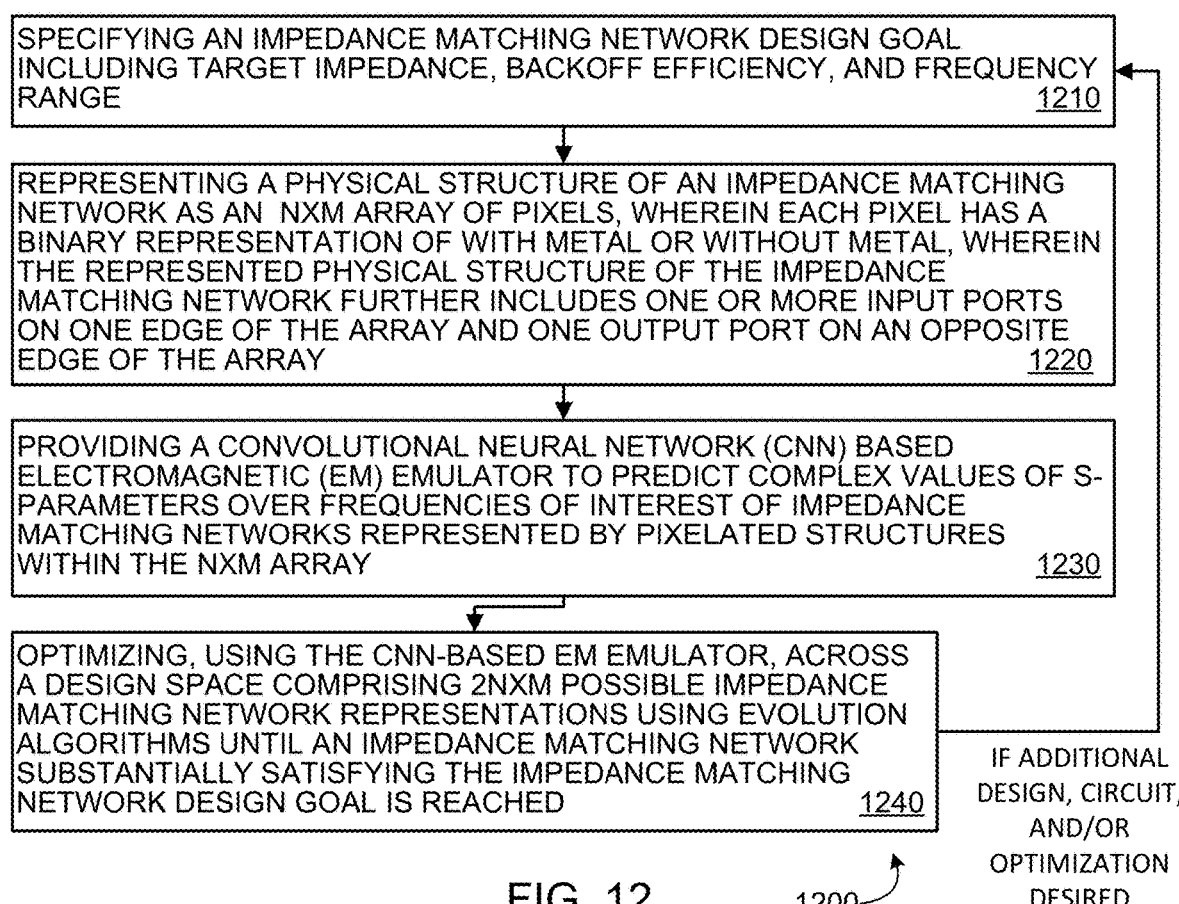

SPECIFYING AN IMPEDANCE MATCHING NETWORK DESIGN GOAL INCLUDING TARGET IMPEDANCE, BACKOFF EFFICIENCY, AND FREQUENCY RANGE                                                                            1210

REPRESENTING A PHYSICAL STRUCTURE OF AN IMPEDANCE MATCHING NETWORK AS AN NXM ARRAY OF PIXELS, WHEREIN EACH PIXEL HAS A BINARY REPRESENTATION OF WITH METAL OR WITHOUT METAL, WHEREIN THE REPRESENTED PHYSICAL STRUCTURE OF THE IMPEDANCE MATCHING NETWORK FURTHER INCLUDES ONE OR MORE INPUT PORTS ON ONE EDGE OF THE ARRAY AND ONE OUTPUT PORT ON AN OPPOSITE EDGE OF THE ARRAY                                                                            1220

PROVIDING A CONVOLUTIONAL NEURAL NETWORK (CNN) BASED ELECTROMAGNETIC (EM) EMULATOR TO PREDICT COMPLEX VALUES OF S-PARAMETERS OVER FREQUENCIES OF INTEREST OF IMPEDANCE MATCHING NETWORKS REPRESENTED BY PIXELATED STRUCTURES WITHIN THE NXM ARRAY                                                                            1230

OPTIMIZING, USING THE CNN-BASED EM EMULATOR, ACROSS A DESIGN SPACE COMPRISING 2NXM POSSIBLE IMPEDANCE MATCHING NETWORK REPRESENTATIONS USING EVOLUTION ALGORITHMS UNTIL AN IMPEDANCE MATCHING NETWORK SUBSTANTIALLY SATISFYING THE IMPEDANCE MATCHING NETWORK DESIGN GOAL IS REACHED                                                                            1240

IF ADDITIONAL DESIGN, CIRCUIT, AND/OR OPTIMIZATION DESIRED

FIG. 12                    1200

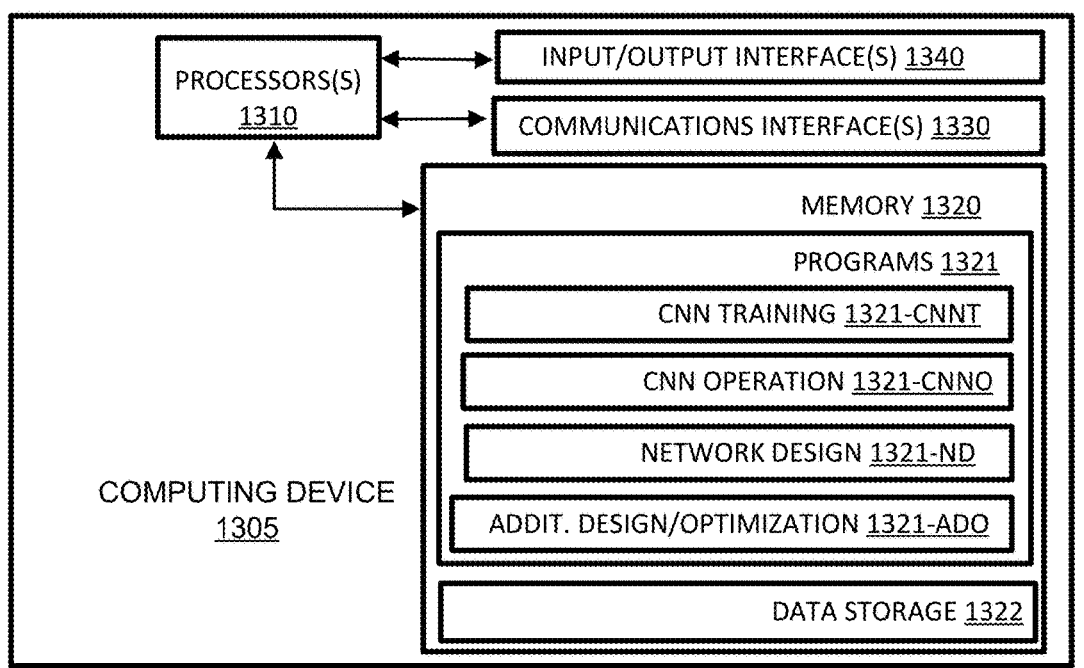

PROCESSORS(S) 1310

INPUT/OUTPUT INTERFACE(S) 1340

COMMUNICATIONS INTERFACE(S) 1330

MEMORY 1320

PROGRAMS 1321

CNN TRAINING 1321-CNNT

CNN OPERATION 1321-CNNO

NETWORK DESIGN 1321-ND

ADDIT. DESIGN/OPTIMIZATION 1321-ADO

DATA STORAGE 1322

COMPUTING DEVICE 1305

FIG. 13

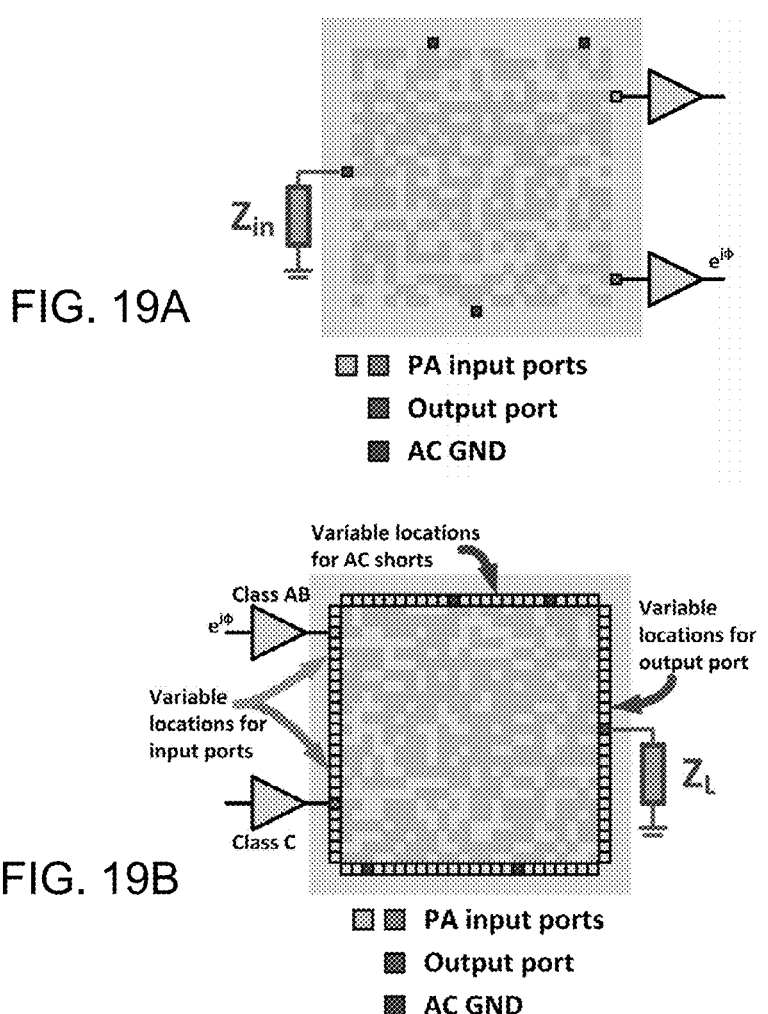
FIG. 19A
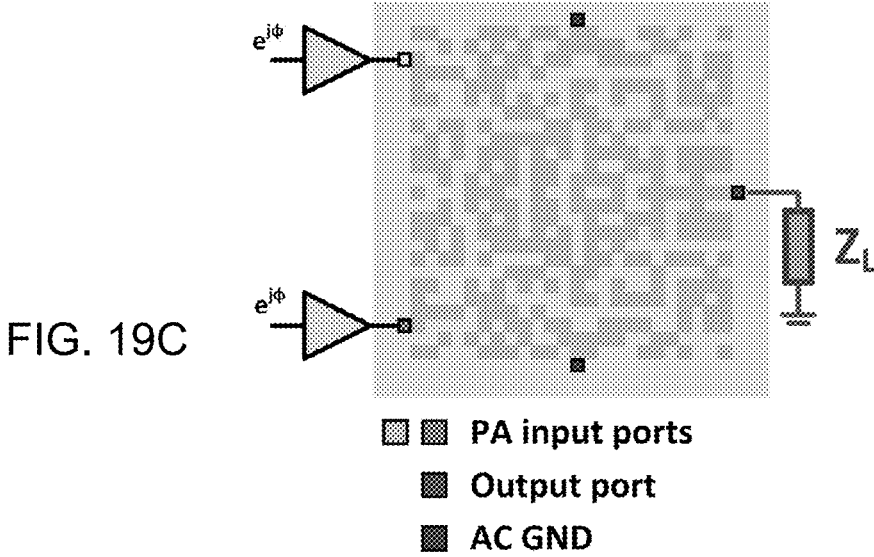
FIG. 19B
FIG. 19C

DEEP LEARNING-ENABLED SYNTHESIS OF ELECTROMAGNETIC STRUCTURES

CROSS-REFERENCE TO RELATED APPLICATION

This application claims the benefit of U.S. Provisional patent application Ser. No. 63/284,704 filed Dec. 1, 2021, which is incorporated herein by reference in its entirety.

STATEMENT REGARDING FEDERALLY SPONSORED RESEARCH OR DEVELOPMENT

This invention was made with government support under Grant No. D18AP00061 awarded by the Defense Advanced Research Projects Agency. The government has certain rights in the invention.

FIELD OF THE DISCLOSURE

The present invention relates to the field of inverse design of multi-Gb/s impedance matching circuits, power amplifiers, and the like.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

The evolving spectral allocations in the mm-wave bands across 24-100 GHz for 5G and beyond, and opportunities of spectrum sharing across licensed/unlicensed bands necessitate future front-ends to address multiple bands spread across the spectrum. In addition, to allow optimal spectral efficiency and frequency diversity in a dynamic resource-constrained environment, concurrent multi-band operation can achieve higher data rates and quality of service ensuring always-connected capability. This is extremely challenging to achieve at the power amplifier (PA) stage requiring the support of GHz channel bandwidths across multiple bands simultaneously over a 3:1 mm-wave bandwidth (30-90+ GHz) with high linearity and efficiency. Output power and efficiency trade-off with such large bandwidth, and can drop significantly with the concurrent multi-band operation.

The first consideration in the design of a 30-90+GHz PA is enabling broadband impedance matching with low loss. Design of such multi-order networks has historically relied on optimization of template geometries. Typically, an initial parametrized model of an impedance network with lumped or distributed components is created (utilizing filter-synthesis methods for example). This is subsequently optimized for bandwidth and loss with time-consuming parameter sweeps, non-convex optimization algorithms, or by exploiting machine learning-enabled regression-based surrogate models. While such a bottom-up approach allows an insight into the operation of the network, any pre-selection of a network topology severely limits the range of all possible electromagnetic (EM) structures to a narrow set of tuning parameters.

Improvements are desired.

SUMMARY

Various deficiencies in the prior art are addressed by systems, methods, mechanisms, apparatus, and improvements thereof providing a machine learning based inverse design method for mm-wave/RF power amplifiers (PAs). Methods according to embodiments provide for efficiently synthesizing power amplifier matching circuit (output matching/output power combiner/backoff efficient output power combiner, interstage matching and input matching/input power divider and phase shifter) for a close to optimum solution in terms of matching bandwidth, efficiency and load modulation, which can exceed the performance limitations of traditional matching network designs. The synthesized high efficiency and broadband power amplifiers enable functionality such as concurrent multi-band operation in application of wireless communication and sensing.

According to one embodiment, a method for designing an impedance matching network comprises: specifying an impedance matching network design goal including input impedance, backoff efficiency, and frequency range; representing a physical structure of an impedance matching network as a N×M array of pixels, wherein each pixel has a binary representation of with metal or without metal, wherein the represented physical structure of the impedance matching network further includes one or more input ports on one edge of the array and one output port on an opposite edge of the array; providing a convolutional neural network (CNN) based electromagnetic (EM) emulator to predict complex values of S-parameters over frequencies of interest of impedance matching networks represented by pixelated structures within the N×M array; and optimizing, using the CNN-based EM emulator, across a design space comprising $2^{N \times M}$ possible impedance matching network representations using evolution algorithms until an impedance matching network substantially satisfying the impedance matching network design goal is reached.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 9A-9C graphically illustrate gain as a function of output power for several single tone continuous wave (CW) input signals of the exemplary PA of FIG. 6;

FIGS. 10A-10B graphically illustrate, respectively, saturation power ($P_{Sat}$), power added efficiency (PAE), collector efficiency (CE) and 6 dB backoff efficiency (BOE) enhancement factor as a function of frequency for the exemplary PA of FIG. 6;

FIG. 12 depicts a flow diagram of a method for designing an impedance matching network according to an embodiment;

FIG. 13 depicts a high-level block diagram of computing device(s) suitable for use in various embodiments;

FIG. 19A depicts an exemplary realized input phase shifter and power divider network;

FIG. 19B depicts an exemplary realized backoff efficient asymmetrical combiner network; and FIG. 19C depicts an exemplary realized in phase symmetrical power combiner network.

Figure 1:
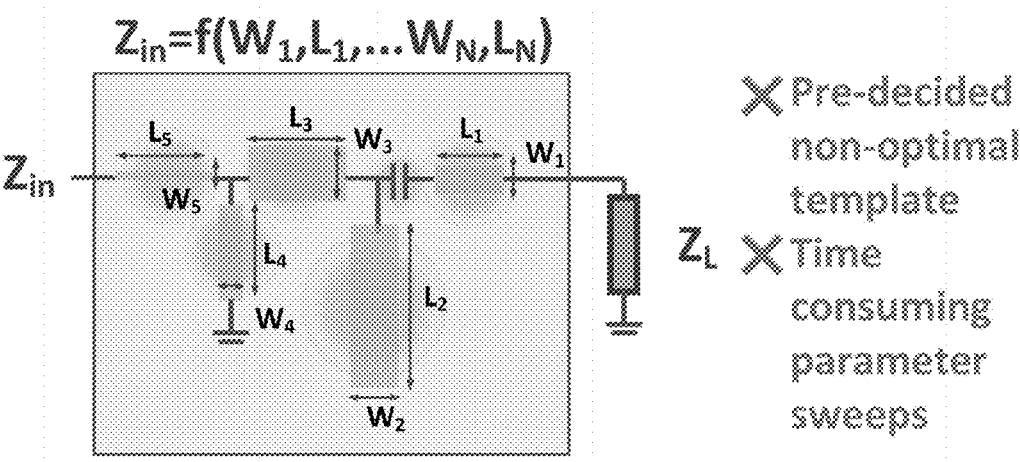
FIG. 1 graphically illustrates the concept and related drawbacks of a traditional template geometry-based power amplifier (PA) design method.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

The following description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or, unless otherwise indicated (e.g., "or else" or "or in the alternative"). Also, the various embodiments described herein are not necessarily mutually exclusive, as some embodiments can be combined with one or more other embodiments to form new embodiments.

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily limit any of the various claimed inventions. Moreover, some statements may apply to some inventive features but not to others. Those skilled in the art and informed by the teachings herein will realize that the invention is also applicable to various other technical areas or embodiments.

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein. It must be noted that as used herein and in the appended claims, the singular forms "a", "an", and "the" include plural referents unless the context clearly dictates otherwise.

Various embodiments provide a machine learning based inverse design method for mm-wave/RF power amplifiers (PAs). Methods according to embodiments provide for efficiently synthesizing power amplifier matching circuit (output matching/output power combiner/backoff efficient output power combiner, interstage matching and input matching/input power divider and phase shifter) for a close to optimum solution in terms of matching bandwidth, efficiency and load modulation, which can exceed the performance limitations of traditional matching network designs. The synthesized high efficiency and broadband power amplifiers enable functionality such as concurrent multi-band operation in application of wireless communication and sensing.

Advantageously, the disclosed PA matching network design methods lead to various high performance PA candidates, which are typically challenging to design using traditional method, including the broadband (>3:1 bandwidth)/multi-band PA and broadband PA with load modulation for high back-off efficiency. The embodiments advance research in the domain wireless communication systems. The general method works for both for mm-wave and RF frequencies and can be implemented either on various integrated technologies or PCB technology which can be a potential candidate for future commercial high speed mobile 5G/6G communication.

The various embodiments enable the use of a much larger design space than conventional design of broadband matching networks, which has relied on optimization of template geometries. However, any pre-selection of a network topology in accordance with such geometries severely limits the range of all possible electromagnetic (EM) structures to a narrow set of tuning parameters. There is no reason to believe that such optimized topologies are close to desirable performance (in terms of bandwidth and loss) in the space of all possible EM structures. To explore a greater design space, the inverse design approach for matching network attempts to search for the EM structure (ideally 3D) that allows close to the optimal distribution of electrical/magnetic energy storage across frequencies for lowest loss broadband matching, which enhances bandwidth and efficiency of the PA. Given a performance target, the method represents the matching structure through an N×M array of pixels with a combination of 1's (with metal) and 0's (without metal), the theoretical $2^N$ possible designs enable exploring the full design space and generating new pixelated topologies for optimized performance. N and M are integers greater than one. It is also noted that while N×M as denoted and described herein define a rectilinear areas, this shape of area is used for simplicity and other regular or irregular areas/shapes may be used within the context of the various embodiments (e.g., with corresponding changes to the array-descriptive terms).

The various embodiments provide a deep convolutional neural network (CNN) based rapid electromagnetic emulator. Treating the structure similarly as an input image matrix, a CNN is used to develop data driven model which can predict the S-parameters instead of time-consuming EM simulations, so the full design space can be rapidly explored and a high performance solution is found (using evolution algorithms such as a Genetic Algorithm) in a reasonable short time. Realization of a robust EM predictor with the deep CNN (one-time training cost of few hours with a high end GPU) allows complete elimination of expensive EM simulations during optimization. It also enables a flexible inverse design approach to rapid EM synthesis (within few minutes) with on demand specifications (multi-band, broadband, impedance ratio etc.) over a very large search space.

The various embodiments approach wideband PA design without using a conventional lumped model, which is typically incapable of modeling frequency dependent parasitics across very large bandwidth. By contrast, the prediction of EM performance using the disclosed EM emulator is valid across the specified wide range of frequency so an accurate guidance of wide band PA matching design is achieved. The disclosed wideband PA design allows new functionality in terms of concurrent multi-band signal transmission for carrier aggregation which boosts system throughput/data rate.

The various embodiments provide a matching synthesis method that is general such that not only the regular 2 port matching networks (output matching, interstage matching and input matching network) can be synthesized efficiently, with enough multi-port training data available, the design flow can be generally expanded to multi-port PA combing/dividing networks with or without load modulation capability. In addition, the AC shorts with arbitrary location can be added into the matching network design so the full matching network equivalents to a complex 3D network (with DC biasing capability) consisting of transmission lines, open stubs, shorted stubs, equivalent series inductance and equivalent series/shunt capacitance. Such high dimension matching network with internal feedback provides solution close to a global optimum point. Moreover, to enable circuit co-design capabilities, ports of the inverse designed network can be terminated with lumped components and active elements.

The inventors have noted that deep learning and artificial intelligence, in general, is advancing scientific discovery and technological inventions through its ability to extract inherently hidden features and map it to output in a highly complex multi-dimensional space. Synthesis of electromagnetic (EM) structures with nearly arbitrary with desired functional properties is such an example of a high dimensional optimization space.

The various embodiments employ deep convolutional neural network (CNN) to allow robust and rapid prediction of scattering properties of nearly arbitrary planar electromagnetic structures on chip. Embodiments are used to generate an exemplary mm-wave PA in 90-nm SiGe with a novel deep learning-enabled inverse design of low-loss, broadband output matching network that achieves a PAE of 16%-24.7%, a saturation power of 16.7-19.5 dBm across $P_{Sat,3dB}$ bandwidth of 30-94 GHz (103.2%), while supporting both single-carrier high-speed modulation and concurrent multiband multi-Gb/s non-constant amplitude modulation. The $P_{Sat,3dB}$ bandwidth covers from 5G band up to W-band and is one of the highest among all reported mm-wave silicon PAs which have peak PAE>20% and demonstrates for the first time concurrent multiband (triple-band) transmission with superior performance at multi-Gb/s.

Within the context to PA design, such as the design of a 30-90+ GHz PA, a first design step is enabling broadband impedance matching with low loss. The design of such multi-order networks has historically relied on the optimization of template geometries. Typically, an initial parametrized model of an impedance network with lumped or distributed components is created (utilizing filter-synthesis methods, for example). This is subsequently optimized for bandwidth and loss with time-consuming parameter sweeps, non-convex optimization algorithms, or by exploiting machine learning-enabled regression-based surrogate models.

FIG. 1 graphically illustrates a concept and related drawbacks of a traditional template geometry-based power amplifier (PA) design method. Unfortunate characteristics include pre-decided non-optimal templates, time consuming parameter sweeps, and the high likelihood that a better design may be realized by some other method. While this bottom-up approach allows an insight into the operation of the network, any preselection of a network topology severely limits the range of all possible electromagnetic (EM) structures to a narrow set of tuning parameters. There is no reason to believe that such optimized topologies are close to "global optimum" performance in the space of all possible EM structures.

Figure 2:
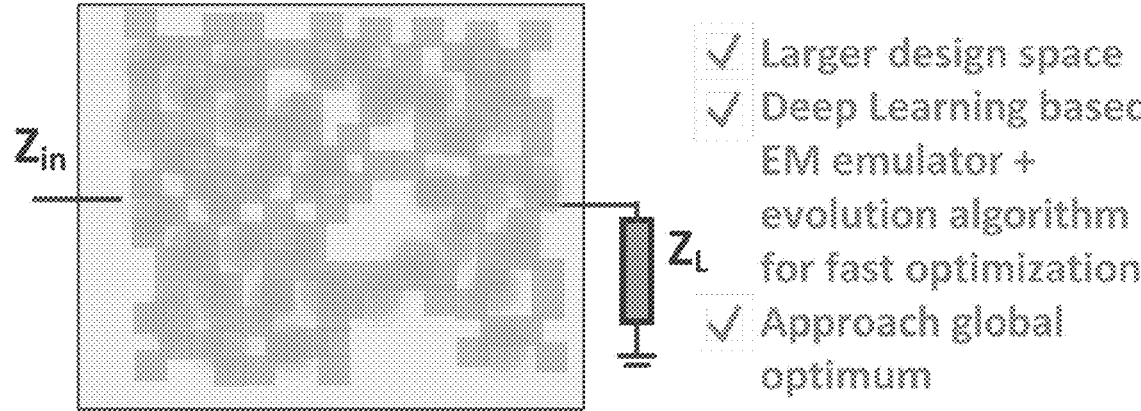
FIG. 2 graphically illustrates the concept and advantages of the method of inverse design for broadband power amplifier (PA) synthesis according to an embodiment.

FIG. 2 graphically illustrates a concept and advantages of an inverse design power amplifier (PA) design method according to an embodiment. Specifically, an inverse design approach is used search for an optimal structure through a top-down approach. For the PA, this is a search for the EM structure (2-D or ideally 3-D) that allows close to optimal distribution of electrical/magnetic energy storage across frequencies for lowest loss broadband matching. Such inverse-designed structures may be irregular, nonintuitive, and seemingly arbitrary, but can exceed the performance limitation of traditional designs. Various embodiments provide a generalized deep-learning-enabled inverse design to synthesize EM structures on demand, providing a design technique for wideband mm-wave PAs ($P_{Sat,3dB}$ bandwidth>3:1) with concurrent multiband transmission.

The following sections will discuss the synthesis flow, considerations, and an exemplary PA design, followed by experimental measurement results obtained by the inventors pertaining to the exemplary design.

Deep Learning-Based Inverse Design of Broadband Mm-Wave PA

A. Deep Learning-Based Inverse Design Method

Figure 3:
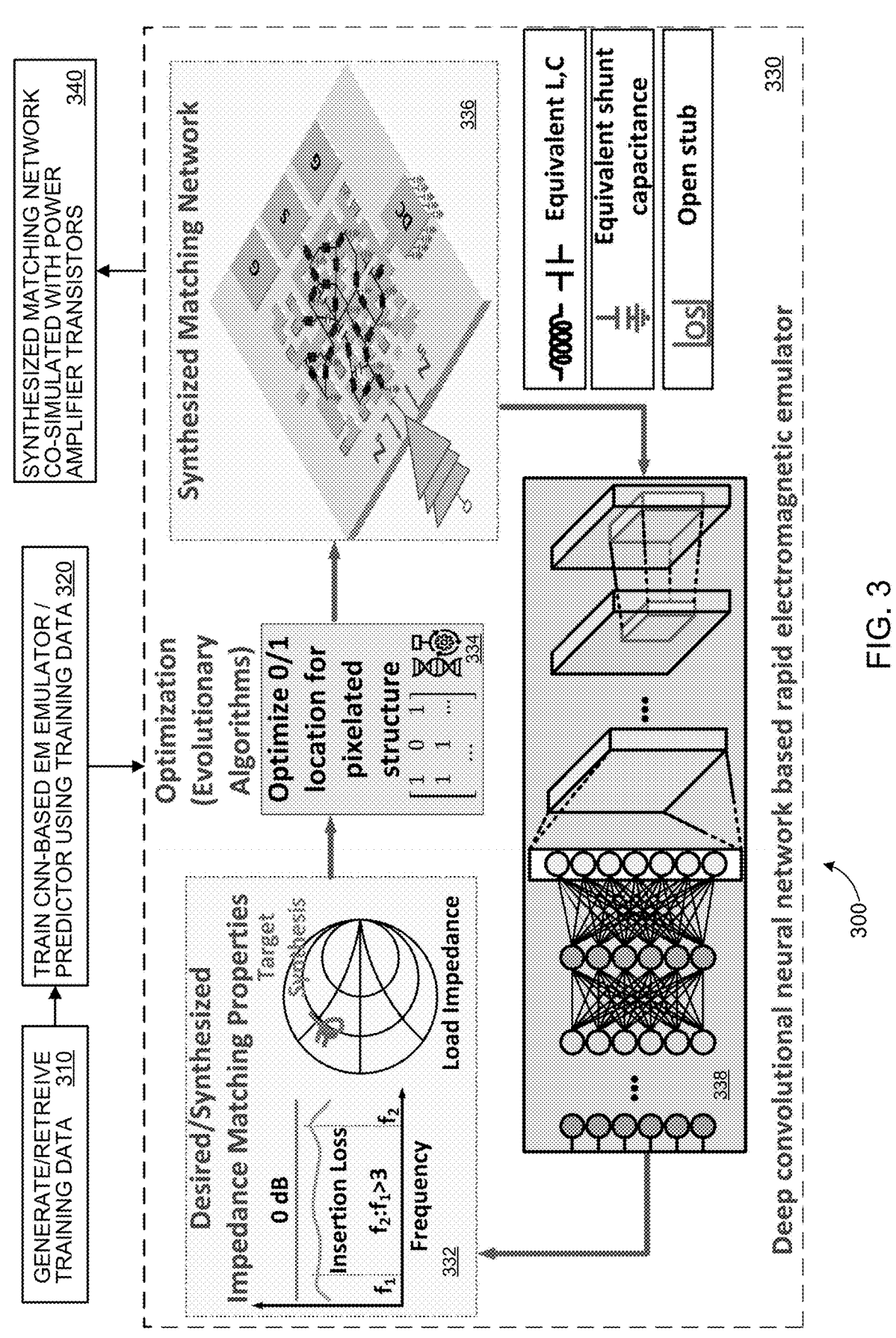
FIG. 3 graphically illustrates the inverse design method for a broadband power amplifier (PA) according to an embodiment.

FIG. 3 graphically illustrates an inverse design method for a power amplifier (PA) according to an embodiment. Specifically, FIG. 3 depicts a machine learning enabled inverse design method according to an embodiment which may be implemented via a computing device, such as a general purpose computer.

At step 310, training data relevant to an electromagnetic (EM) emulator, power amplifier circuitry, and the like is generated or retrieved. The training data may be generated by scientific computing software such as Matlab or HFSS. Generally speaking, the training data consists of randomized multi-port pixelated structure and their S-parameters. Pixelated structure can be of various sizes, port numbers, discretization and dielectric stackup dictated by the manufacturing technology. Manufacturing technology can include various chip process nodes or printed circuit boards.

At step 320, a convolutional neural network (CNN)-based electro-magnetic (EM) emulator/predictor is trained using the training data, the training optionally performed using model parameter adjustments selected to improve training speed and/or reduce training loss.

At step 330, the CNN-based EM emulator/predictor or its architecture is trained at step X20 is used within the context of an iterative optimizing process or evolution algorithm for synthesizing an impedance matching network having desirable impedance matching performance.

Specifically, desired or synthesized impedance matching properties of a current optimization iteration 332 are represented as optimized 0/1 locations in a pixelated structure of a large design space 334 to provide thereby a synthesized matching network 336, which is emulated 338 by the CNN-based EM emulator/predictor to generate thereby current synthesized impedance matching properties of the matching network. With each iteration, the 0/1 locations in the pixelated structure are further improved in accordance with improved impedance matching properties generated by current emulation of the synthesized matching network by the CNN-based EM emulator/predictor.

At step 340, the simulated or synthesized matching network is co-simulated with power amplifier transistors to demonstrate desirable small and large signal performance associated with the network.

Steps 310-330 may be performed using simulation and mathematical tools including HFSS and Matlab, and step 340 may be performed using ADS.

The full PA architecture may then be implemented in hardware such as via an integrated silicon technology (e.g., SiGe 90 nm technology). The resulting PA architectures may comprise a fabricated 2 stage single-ended PA utilizing common-base transistors for both power stage and driver stage, with a transmission line based broadband interstage matching and input matching network, and an inverse designed output matching network for broadband performance (>3:1 relative bandwidth).

The method 300 described above may be further expanded, as discussed herein with respect to the various figures, to achieve broadband input matching and interstage matching, and/or broadband power combining, and/or potential broadband load modulation for back off efficiency enhancement.

Various enhancements may be made by improving CNN model accuracy such as via more extensive parameter selection and tuning, or increasing the resolution of the pixelated structure (i.e., increasing N or M in the N×M matrix) though increasing the resolution will require more computation resources.

The design method 300 of FIG. 3 demonstrates three primary advantages; namely, being able to improve upon classical designs by exploring a very large design space (e.g., a high-dimension search space), the size of which is impractical to explore with interactive time-intensive EM simulations, while providing EM performance valid across a wider frequency range that achievable with lumped modeling.

First, the various embodiments enable optimization of design across a much larger design space than provided by pre-decided template-based geometries. Given an optimization goal (network impedance ratio, bandwidth, insertion loss target), in contrast to the traditional method of tuning physical dimensions of a known topology, the inverse design method discretizes the output matching network space to N×M pixels with a combination of "1"s/"0"s that represent presence/absence of metal, respectively. The full design space of theoretical $2^{2 \times M}$ possible structures can be explored for optimized performance.

Second, the navigation of this high-dimensional search space cannot be accomplished with optimization algorithms that rely on iterative time-intensive EM simulations. To this end, a deep convolutional neural network (CNN)-based EM emulator is realized that allows rapid prediction of scattering properties of arbitrary physical geometries in the 2-D space. When combined with an optimization algorithm (such as GA), an inverse design method is provided for rapid synthesis of EM structures on-demand with the desired scattering properties and investigate a very large search space with arbitrary geometries, not possible to address with traditional optimization and iterative EM simulations.

Third, compared to lumped modeling, the prediction of EM performance in the various embodiments is valid across a very wide frequency range, allowing accurate guidance of a wideband PA matching design.

B. Deep CNN EM Predictor Design Considerations

Figure 4:
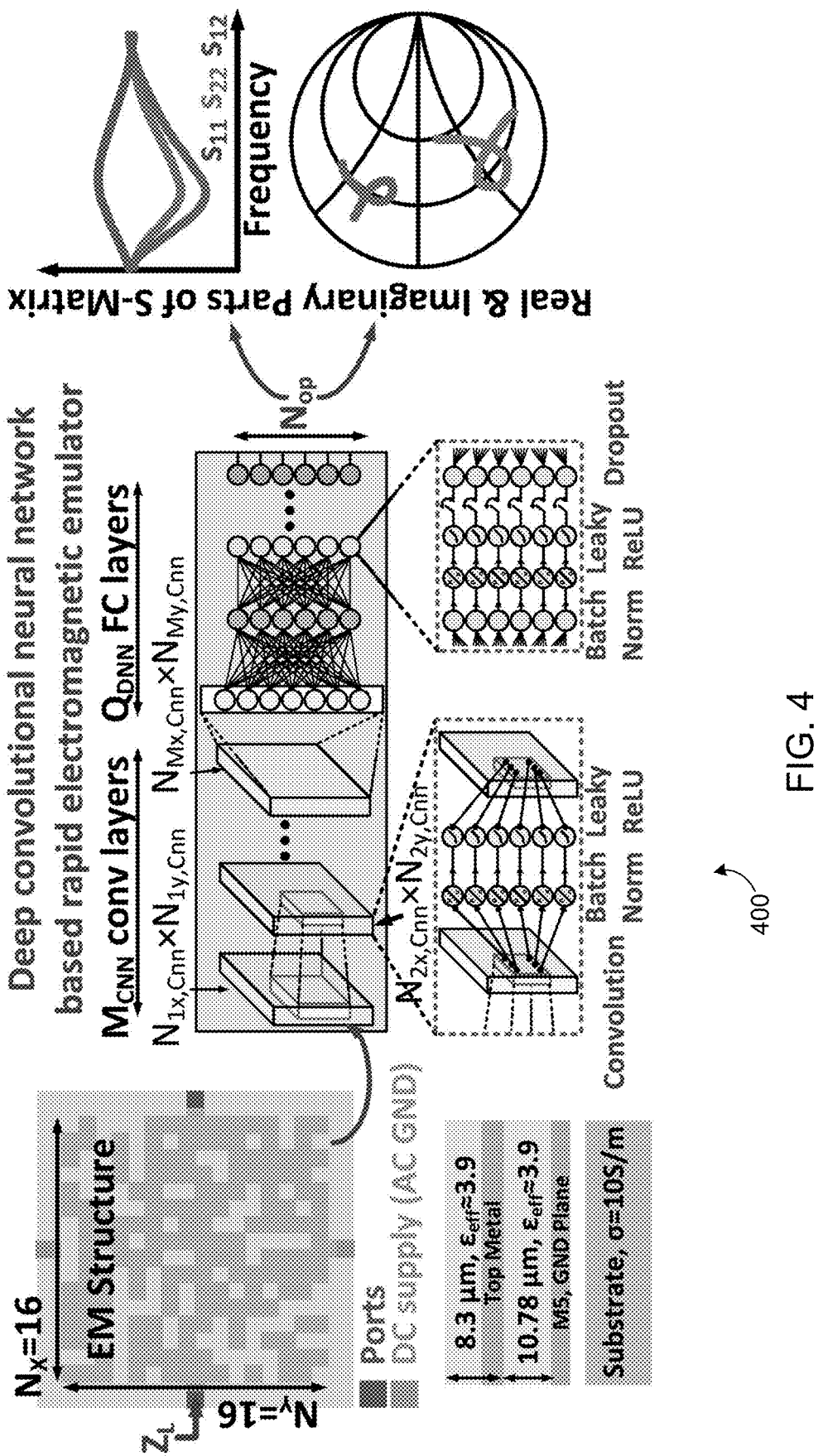
FIG. 4 graphically illustrates a deep convolutional neural network (CNN) model for rapid prediction of arbitrary pixelated EM structures suitable for use in the design method of FIG. 3.

Realization of a robust EM predictor with the deep CNN allows complete elimination of expensive EM simulations during optimization. Given that the 2-D pixelated "1"s/"0"s distribution relates to the scattering parameters of the realized EM structure, we train a deep CNN model over a set of planar structures to extract the relevant features. With 256 binary input (pixel number n=m=16 in the examples, though larger and smaller values of N or M may be used) representing the EM structure, a single network predicts the complex values of S11, S21, and S22 discretized over the frequency range. At the same time, it is possible to train CNN models for multi-port networks that will predict multi-port S-parameters. FIG. 4 graphically illustrates a deep convolutional neural network (CNN) model for rapid prediction of arbitrary pixelated EM structures suitable for use in the design method of FIG. 3.

Figure 5:
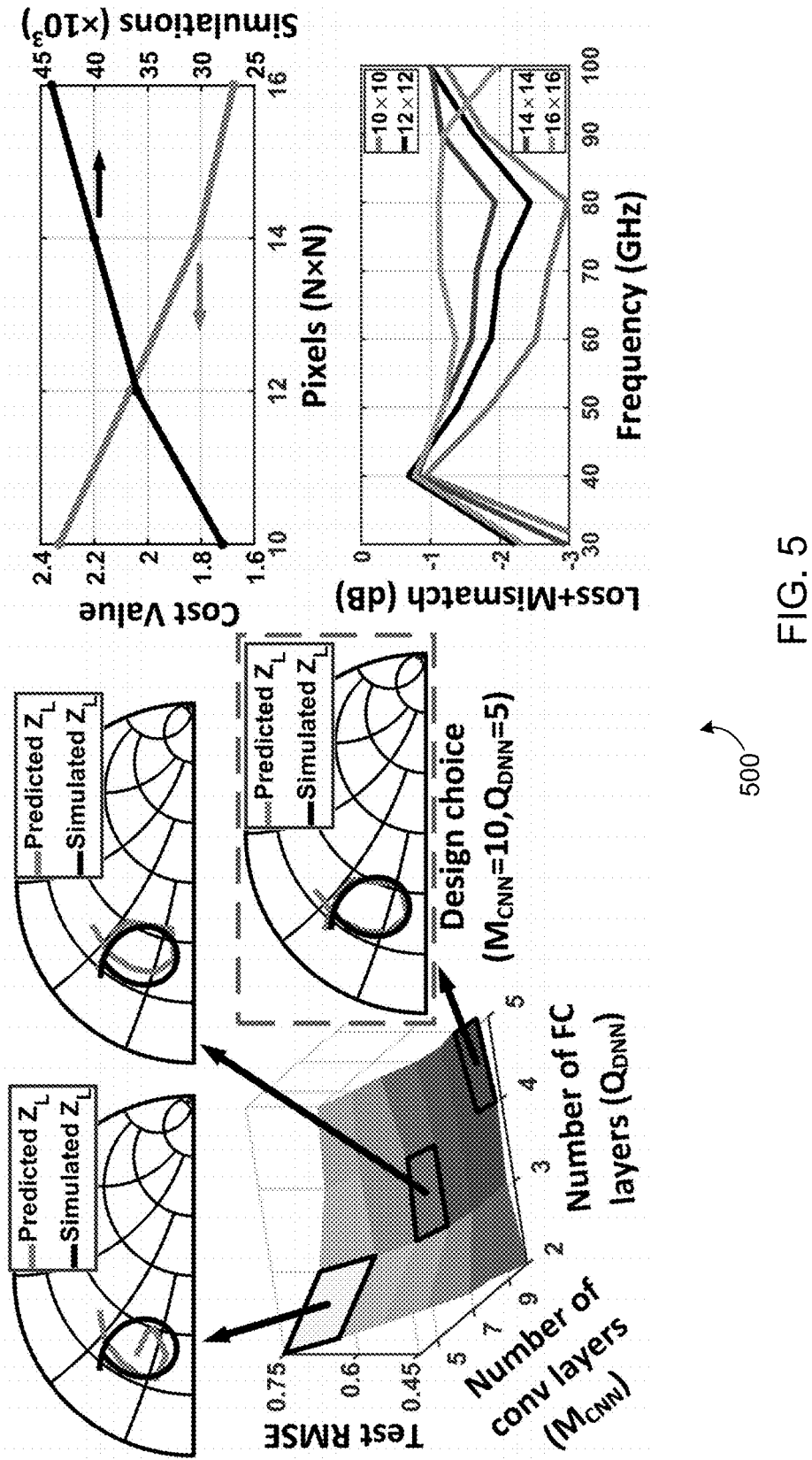
FIG. 5 graphically illustrates exemplary choices of number of layers and pixels for accurate EM prediction and synthesis of broadband matching suitable for use in the model of FIG. 4.

FIG. 5 graphically illustrates exemplary choices of number of layers and pixels for accurate EM prediction and synthesis of broadband matching suitable for use in the model of FIG. 4. Impedance matching networks, PA networks, and other networks/circuits synthesized using the various embodiments may include active discrete devices and/or active on-chip devices.

As shown in FIG. 5, the final network consists of ten convolutional and five fully connected (FC) layers allowing a low root-mean-square error (RMSE) between 30 and 100 GHz over 20 K test samples, indicating excellent prediction accuracy. Both convolution and FC layers contain batch normalization and leaky rectified linear unit (ReLU) activation functions, and the latter contains dropout layers to avoid over-fitting. Once the model is created, we can employ any optimization algorithm to create structures on-demand within minutes. To reduce the computational investment on the dataset generation, various embodiments adopt a transfer learning based training approach. In the first step, large number of cheap simulations (~70 K) were performed and a randomly initialized CNN was trained over this dataset. Afterwards, this model was retrained with smaller number of expensive but accurate simulations (FIG. 5B). In addition, data augmentation techniques (flipping or rotating) were applied to enlarge the dataset. Since loss minimization relates to the distribution of electrical/magnetic energy over the structure, a higher number of pixels allows more precise control with a lower cost function, and a better low-loss, broadband, and compact matching network, at the expense of more computational investment, as can be seen in FIG. 5. For purposes of illustration, a 16×16 grid (N=M=16) was deemed as an acceptable trade-off given the achieved Psat bandwidth. Intuitively, the distributed pixelated network, enabled by the deep-CNN model, realizes a multi-order 2-D LC lattice network with distributed shunt capacitance to form a broadband matching network. With enough random training data, CNN can distinguish samples that do not have a dc path from the input port to the output port. The CNN model can predict the electromagnetic behavior of the surface from its image. With the network generating accurate predictions, it can be utilized in an optimization loop for the synthesis of a desired electromagnetic response.

C. Broadband PA Implementation

Figure 6:
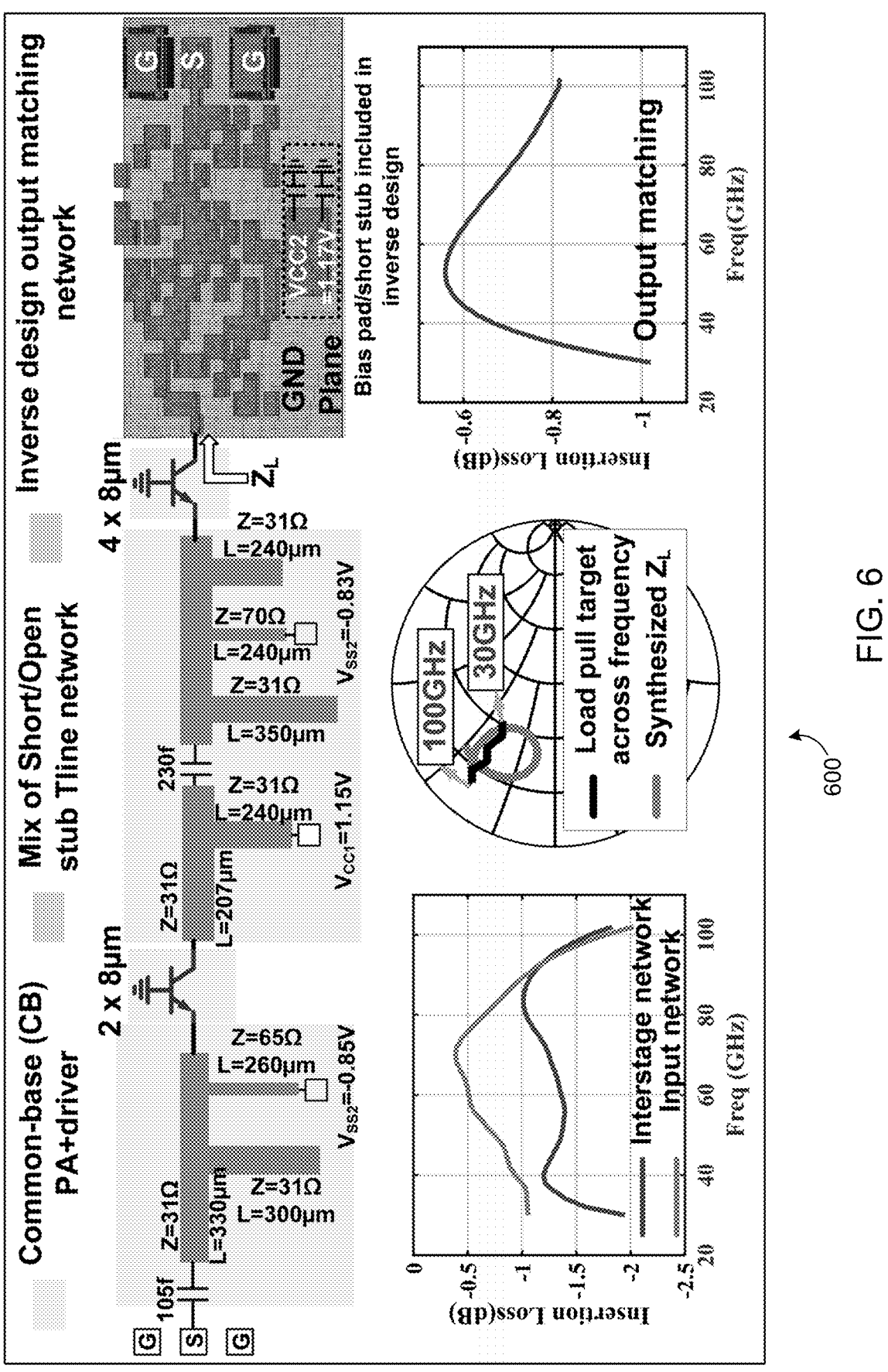
FIG. 6 graphically illustrates a schematic diagram of an exemplary power amplifier (PA) realized using an embodiment.
Figure 7:
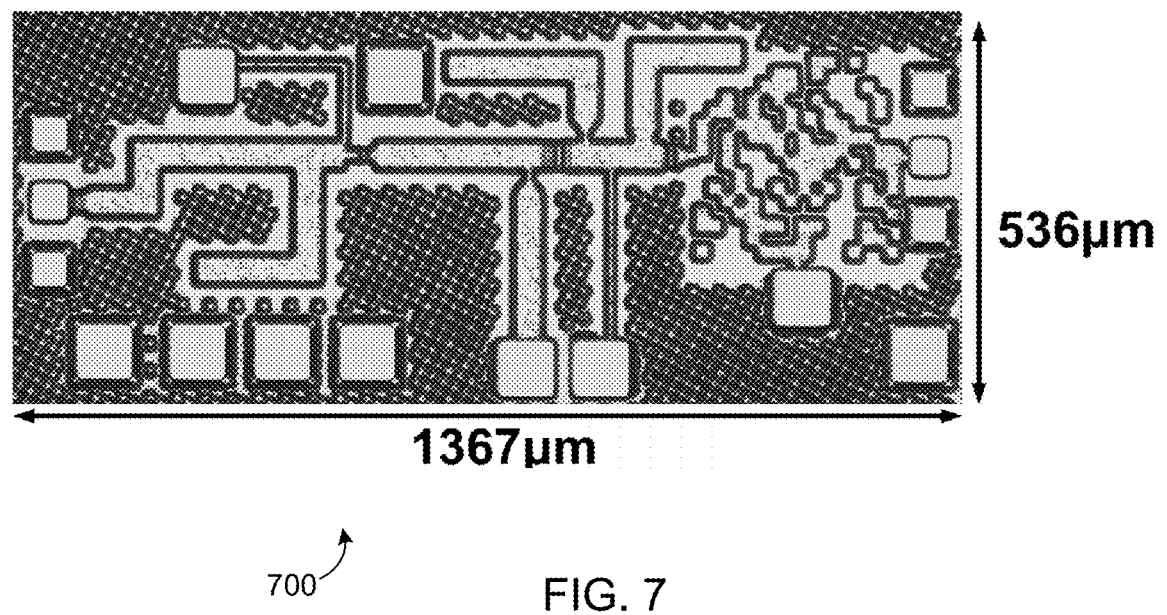
FIG. 7 depicts a in integrated circuit (IC) micrograph of the exemplary PA of FIG. 6.

FIG. 6 graphically illustrates a schematic diagram of an exemplary power amplifier (PA) realized using an embodiment as discussed above. FIG. 7 depicts an integrated circuit (IC) micrograph of the exemplary PA of FIG. 6. Specifically, the realized PA, using the inverse designed broadband pixelated structure (compact 300 μm×300 μm size) as an output matching network with a port for power supply (2 V) is realized in a 90-nm SiGe process. The two-stage PA is based on a common-base (CB) topology due to higher breakdown voltage ($BV_{cbo}$), higher maximum available gain, sharper compression behavior, and superior back-off efficiency enhancement due to the current clamping effect. The desired and synthesized load-pull contour for power and PAE across 30-100 GHz show the broadband nature of the network that exhibits a low insertion loss of 0.55-1 dB.

The exemplary fabricated PA discussed herein is realized on a 90 nm SiGe integrated circuit technology. The fully integrated protype chip occupies an area of $0.732$ mm$^2$ and is tested using both continuous wave (CW) and high speed modulated signal from 30-102 GHz. The realized mm-wave prototype PA achieves $P_{Sat,3dB}$ bandwidth of 30-94 GHz (>3:1) and PAE of 16-24.7%, it also supports singe carrier and concurrent dual band/triple band high speed data modulation across broadband frequency range exhibiting decent linearity. Compared to state of the arts publications, the Psat 3 dB bandwidth of the presented PA covers from 5G band up to W and stands out with one of the highest $P_{Sat,3dB}$ bandwidth (103.2%).

III. Measurement Results

Figure 8:
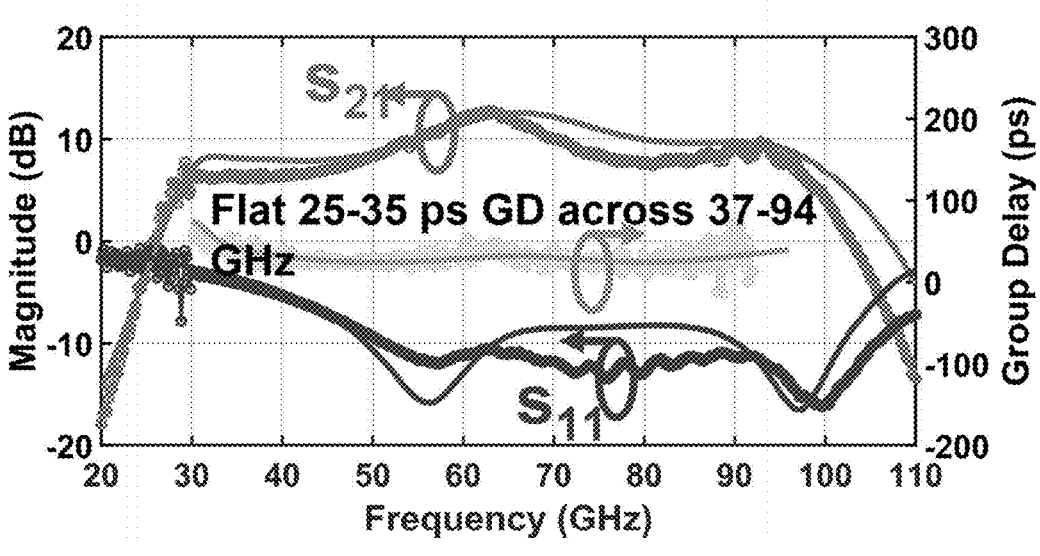
FIG. 8 graphically depicts simulated and measured small-signal results of the operation of the exemplary PA of FIG. 6.

FIG. 8 graphically depicts simulated and measured small-signal results of the operation of the exemplary PA of FIG. 6. Specifically, FIG. 8 shows the measured and simulated small-signal S-parameters. The peak S21 is 12.5 dB at 66 GHz (S21.3 dB bandwidth of 21 GHz), and the measured S11 is below −10 dB from 50 to 105 GHz. The measured group delay shows a flat 25-35 ps response cross 37-94 GHz.

FIGS. 9A-9C graphically illustrate gain as a function of output power for several single tone continuous wave (CW) input signals of the exemplary PA of FIG. 6.

FIGS. 10A-10B graphically illustrate, respectively, saturation power ($P_{Sat}$), power added efficiency (PAE), collector efficiency (CE) and 6 dB backoff efficiency (BOE) enhancement factor as a function of frequency for the exemplary PA of FIG. 6. Specifically, FIGS. 10A-10B show the measured large-signal performance between 30 and 102 GHz, 30 and 94 GHz, the PA achieves between 16.5 and 19.5 dBm $P_{Sat}$ with sharp compression ($P_{Sat}$–$P_{1db}$~0.6-1.9 dB), 16%-24.7% PAE, and 19%-27.5% total collector efficiency ($\eta$) including driver and output. The PA achieves a 6-dB back-off efficiency enhancement of 1.75-2.45 times class-A across 30-102 GHz. High-speed modulation test using single-carrier signals is also tested between 40 and 88 GHz. Without DPD, the PA demonstrates $P_{Avg}$/$PAE_{Avg}$ of 12.6 dBm/10.7% for 4.5 Gb/s 64-QAM signal with −26.4 dB EVM and −32.8 dBc ACLR at 40 GHz, and 11.5 dBm/ 10.5% for 4.5 Gb/s 64-QAM signal with −23.6 dB EVM at 66 GHz.

Figure 11A:
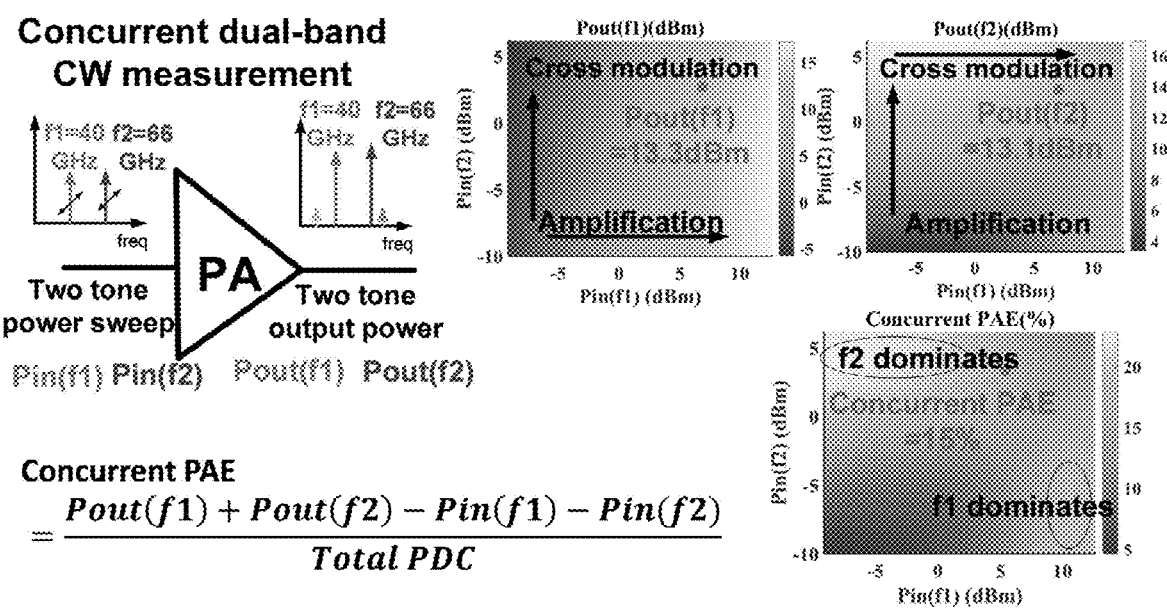
FIGS. 11A-11B graphically illustrate, respectively, concurrent two-tone CW test results and concurrent triple-band modulation test results for the exemplary PA of FIG. 6.
Figure 11B:
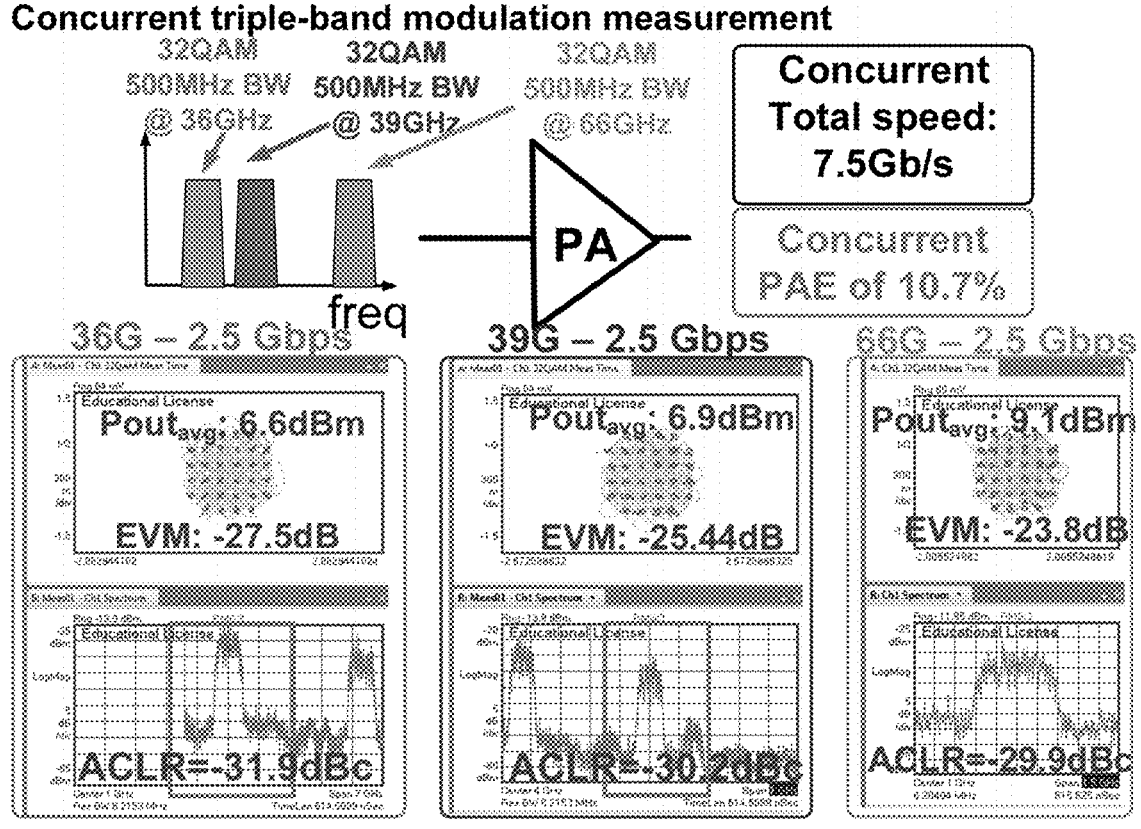

FIGS. 11A-11B graphically illustrate, respectively, concurrent two-tone CW test results and concurrent triple-band modulation test results for the exemplary PA of FIG. 6. Specifically, FIG. 11A shows a 2-D plot of power variations of $f_1$=40 GHz (licensed spectrum) and $f_2$=66 GHz (unlicensed spectrum) as the power of $f_2$ and $f_1$ are varied in a two-tone CW test. The cross-modulation where the output power is degraded at one frequency as the input power of the other frequency increases is observed. As can be seen, the PA achieves concurrent CW operation with an output power of 13 dBm at each frequency with 15% concurrent PAE. The intermodulation products in the broadband PA are at 10 dBc and below (maximum at $2f_1$) and can be suppressed with succeeding filters and antennas. Concurrent triple-band operation at 36, 39, and 66 GHz each with 2.5 Gb/s 32 QAM modulation and aggregate data rate of 7.5 Gb/s is shown in FIG. 11B using a well-calibrated measurement setup. In a concurrent operation, the PA reaches $P_{Avg}$ of 6.1/6.9/9.1 dBm, EVM of −27.5/−25.4/−23.8 dB, and ACLR of −31.9/−30.2/−29.9 dBc at 36/39/66 GHz, respectively, with a concurrent PAE of 10.7%.

Enabled by the deep learning approach, the various embodiments discussed above report one of the highest $P_{Sat,3dB}$ bandwidth compared to the state-of-the-art silicon PAs with a concurrent multiband mm-wave operation (Table 1). Such inverse design methods enable new design space for rapid EM/circuit synthesis and, more importantly, untapped functionalities in RF/mm-wave circuits and systems.

tively) $2^{2 \times M}$ possible impedance matching network representations is made using evolution algorithms as described above until an impedance matching network substantially satisfying the impedance matching network design goal is reached.

The method 1200 is repeated for additional design (e.g., additional impedance matching networks in a circuit being created/optimized, additional circuit(s), and/or optimization

TABLE 1

| | This work | | | | | | | Wang, [10] | Huang [9] | Callender [7] | Vigilante [2] |
|---|---|---|---|---|---|---|---|---|---|---|---|
| Technology | 90 nm SiGe | | | | | | | 45 nm SOI | 45 nm SOI | 22 nm Finfet | 28 nm CMOS |
| Architecture | Inverse designed output matching | | | | | | | Distributed Balun | Coupler Doherty | Transformer coupled | Transformer coupled |
| $P_{sat}$ BW$_{3\,dB}$ (GHz) | 30-94 (103.2%) | | | | | | | 22-43 (65%) | 26-55 (85%) | 60-90 (40%) | 27-58 (73%) |
| Freq (GHz) | 30 | 40 | 50 | 66 | 78 | 88 | 94 | 24-42 | 26-60 | 60-90 | 27-58 |
| $P_{sat}$ (dBm) | 17.5 | 19.5 | 19 | 17.7 | 18.4 | 17.4 | 16.7 | 17.9-20.4 | 19.9-22 | 9.5-12.5 | 13.6-16.6 |
| $P_{1\,dB}$ (dBm) | 16.3 | 18.2 | 18.3 | 15.8 | 17.8 | 15.6 | 15.5 | 15.7-19.6 | 18.3-21.5 | -2-10 | 7.5-13.5 |
| Peak PAE (%) | 17.1 | 19.5 | 21 | 20 | 21.9 | 17.6 | 14.5 | 35-45 | 23.3-40.5 | 13-26 | 8-24 |
| Class A 6 dB PBO η enhancement ratio | ×1.9 | ×2.4 | ×1.8 | ×1.9 | ×2.3 | ×1.7 | ×2.1 | ×1.8-2.2 | ×2-×3.4 | NA. | NA. |
| Modulation | 64 QAM | | | | | | | 64QAM | 64QAM | 64QAM | 64QAM |
| Carrier Freq (GHz) | 36 | 40 | 50 | 60 | 66 | 88 | | 24-42 | 32/40/50 | 75 | 28/32/34 |
| Data Rate(Gbps) | 6 | 4.5 | 4.5 | 4.5 | 4.5 | 2.4 | | 0.8 | 3 | 9 | 3 |
| EVM (dB) | -25 | -26.4 | -24.6 | -25.2 | -23.6 | -27 | | -25.1 | -25 | -28 | <-25 |
| ACPR (dBc) | -33 | -32.8 | -30.7 | -28.9 | -28.8 | -30.6 | | -28 to -25 | -27 to -30 | NA. | -38/-34/-30 |
| $P_{avg}$ (dBm) | 12.5 | 12.6 | 12.2 | 11.7 | 11.5 | 10.55 | | 8.4-11.3 | 9.8-13.4 | 1.3 | 6.8/8.1/8.9 |
| $PAE_{avg}$ (%) | 11.2 | 10.7 | 10.4 | 11.2 | 10.5 | 8.3 | | 10.3-16.6 | 10.7-24.8 | 5 | 2.9/3.9/4.4 |
| Concurrent Modulation | 36 GHz 2.5 Gbps 32 QAM | | 39 GHz 2.5 Gbps 32 QAM | | 66 GHz 2.5 Gbps 32 QAM | | | NA. | NA. | NA. | NA. |
| EVM(dB)/ ACLR(dBc)/ $P_{avg}$(dBm) | -27.5/-31.9/6.6 | | -25.4/-30.2/6.9 | | -23.8/-29.9/9.1 | | | | | | |
| Concurrent PAE | 10.7% | | | | | | | | | | |
| Area (mm²) | 1367 × 536 (0.732) | | | | | | | 1.35 | 2.28 | 0.054 | 0.16 |

FIG. 12 depicts a flow diagram of a method for designing an impedance matching network according to an embodiment. The method 1200 may be used to design one or more impedance matching networks and related circuitry for use in a circuit to be realized after such design. In various embodiments, the method 1200 of FIG. 12 is used to design multiple impedance matching networks for use in various circuits of interest such as, illustratively, various power amplifier circuit configurations. Each impedance matching network may be further refined in response to the design of an adjacent or related impedance matching network within the various circuits of interest.

At step 1210, an impedance matching network design goal is specified, the design goal including target impedance, backoff efficiency, and frequency range.

At step 1220, a representation is provided of a physical structure of an impedance matching network as an array of pixels (illustratively a N×M array), wherein each pixel has a binary representation of with metal or without metal, wherein the represented physical structure of the impedance matching network further includes one or more input ports on one edge of the array and one output port on an opposite edge of the array.

At step 1230, a convolutional neural network (CNN) based electromagnetic (EM) emulator is provided to predict complex values of S-parameters over frequencies of interest of impedance matching networks represented by pixelated structures within the (illustratively) N×M array.

At step 1240, using the CNN-based EM emulator, an optimization across a design space comprising (illustraof designed/created optimized impedance matching networks, circuits, and the like so as to provide further individual optimizations so as to find a broadly optimized circuit. For example, exemplary embodiments discussed herein are used to provide multiple impedance matching networks for use in a power amplifier (PA) circuit, wherein additional optimizations may be performed to find a broadly optimized PA circuit.

FIG. 13 depicts a high-level block diagram of computing device(s) suitable for use in various embodiments. The computing device(s) 1305 depicted in FIG. 13 comprises a computing device that may be configured to perform various computing, processing, control, design, convolution neural network (CNN) training, CNN operation, and/or other functions such as described herein with respect to the figures and equations. For example, the computing device(s) 1305 may perform various functions such as described herein with respect to the various figures. Generally speaking, in addition to performing various calculations and processing as described herein with respect to the various figures, equations, and embodiments, the computing device 1305 may be used to perform the functions of the method 1200 of FIG. 12 as well as the other methods described herein.

As depicted in FIG. 13, the computing device(s) 1305 includes one or more processors 1310, a memory 1320, a communications interface 1330, and input-output (I/O) interface(s) 1340. The processor(s) 1310 are coupled to each of memory 1320, communication interfaces 1330, and I/O interfaces 1340.

The processor(s) 1310 are configured for controlling the operation of computing device(s) 1305, including operations supporting the methodologies described herein with respect to the various embodiments. Similarly, the memory 1320 is configured for storing information suitable for use by the processor(s) 1310. Specifically, memory 1320 may store programs 1321, data 1322 and so on. Within the context of the various embodiments, the programs 1321 and data 1322 may vary depending upon the specific functions implemented by the computing device(s) 1305. For example, as depicted in FIG. 13, the programs portion 1321 of memory 1320 includes a CNN training program 1321-CNNT to assist in training a CNN as described herein, a CNN operation program CNNO for controlling and/or providing a CNN as described herein, a network design program 1321-ND for designing/optimizing impedance matching networks, circuits, and portions thereof, and an additional design/optimization program 1321-ADO providing any additional designing/optimizing of impedance matching networks, circuits, and portions thereof. Other programs may be included within the memory 1320 as needed to implement functions discussed herein with respect to the various embodiments.

Generally speaking, the memory 1320 may store any information suitable for use by the computing device(s) 1305 in implementing one or more of the various methodologies or mechanisms described herein. It will be noted that while various functions are associated with specific programs or databases, there is no requirement that such functions be associated in the specific manner. Thus, any implementations achieving the functions of the various embodiments may be used.

The communications interfaces 1330 may include one or more services signaling interfaces adapted to facilitate the transfer of information, files, data, messages, requests and the like between various entities in accordance with the embodiments discussed herein.

The I/O interface 1340 may be coupled to one or more presentation devices (not shown) such as associated with display devices for presenting information to a user, one or more input devices (not shown) such as touch screen or keypad input devices for enabling user input, and/or interfaces enabling communication between the computing device(s) 1305 and other computing, networking, presentation or other local or remote input/output devices (not shown).

Various embodiments are implemented using a computing device(s) 1305 comprising processing resources (e.g., one or more servers, processors and/or virtualized processing elements or compute resources) and non-transitory memory resources (e.g., one or more storage devices, memories and/or virtualized memory elements or storage resources), wherein the processing resources are configured to execute software instructions stored in the non-transitory memory resources to implement thereby the various methods and processes described herein. As such, the various functions depicted and described herein may be implemented at the elements or portions thereof as hardware or a combination of software and hardware, such as by using a general purpose computer, one or more application specific integrated circuits (ASIC), or any other hardware equivalents or combinations thereof. In various embodiments, computer instructions associated with a function of an element or portion thereof are loaded into a respective memory and executed by a respective processor to implement the respective functions as discussed herein. Thus various functions, elements and/or modules described herein, or portions thereof, may be implemented as a computer program product wherein computer instructions, when processed by a computing device, adapt the operation of the computing device such that the methods or techniques described herein are invoked or otherwise provided. Instructions for invoking the inventive methods may be stored in tangible and non-transitory computer readable medium such as fixed or removable media or memory, or stored within a memory within a computing device operating according to the instructions.

It is contemplated that some of the steps discussed herein as software methods may be implemented within special-purpose hardware, for example, as circuitry that cooperates with the processor to perform various method steps.

Although primarily depicted and described as having specific types and arrangements of components, it will be appreciated that any other suitable types and/or arrangements of components may be used for computing device(s) 1305.

Figure 14:
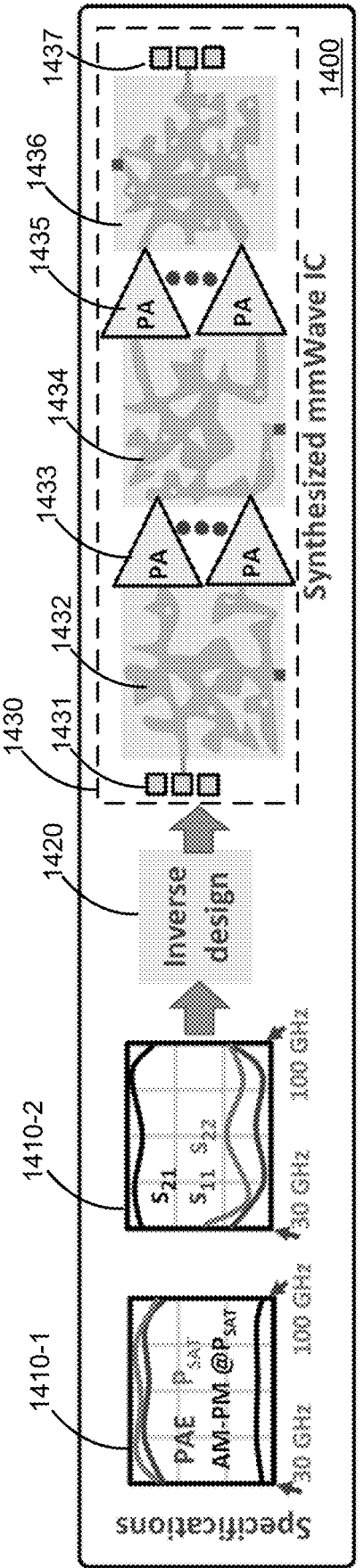
FIG. 14 graphically illustrates an inverse design method according to an embodiment.

FIG. 14 graphically conceptually illustrates an inverse design method according to an embodiment. Specifically, the inverse design method 1400 of FIG. 14 is similar to the methods described above with respect to the various embodiments. As shown in FIG. 4, first 1410-1 and second 1410-2 specifications may have any form useful in presenting desired conditions, such as impedance targets for one or more conditions (e.g., $P_{Sat,3dB}$ bandwidth conditions), small signal parameters for one or more conditions, and so on. An inverse design process 1420 optimizing for the desired conditions is then performed to generate a realizable circuit 1430 in accordance with the one or more conditions 1430. As shown in FIG. 14, the realized circuit 1430 comprises one or more input ports/connections 1431 provides received signal(s) to a first impedance matching network 1432, which provides impedance matched output signal(s) to a first stage of one or more driver or power amplifiers 1433, which provide amplified signal(s) to a second impedance matching network 1434, which provides impedance matched output signal(s) to a second stage of one or more driver or power amplifiers 1435, which provide amplified signal(s) to a third impedance matching network 1436, which provides output signal(s) to one or more output ports/connections 1437.

Figure 15:
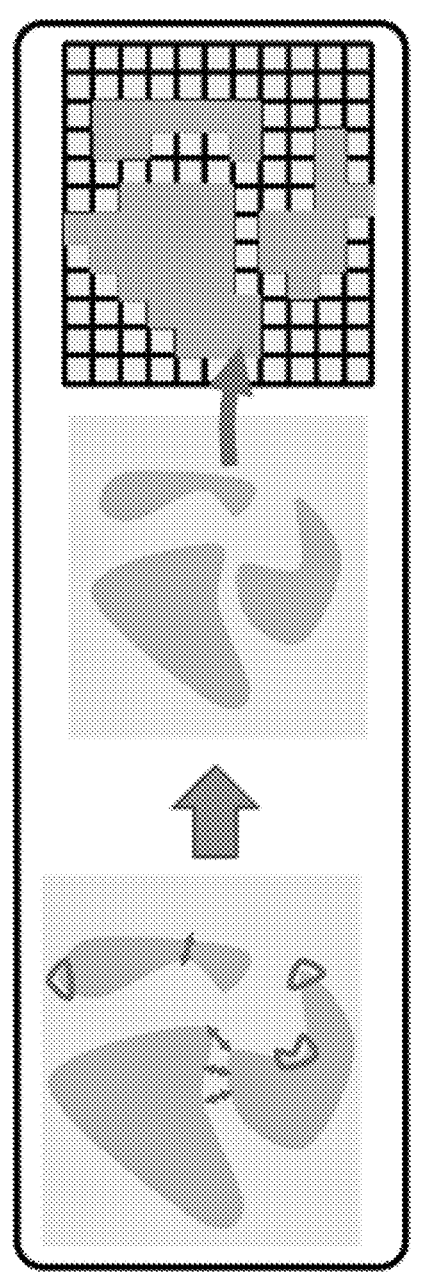
FIG. 15 graphically illustrates impedance matching networks formed as arbitrary surfaces which, when provided via a grid or array as discussed herein lead to improved manufacturability and reliability of such networks.

FIG. 15 graphically illustrates impedance matching networks formed as arbitrary surfaces which, when provided via a grid or array as discussed herein lead to improved manufacturability and reliability of such networks. It is noted that curvatures, metal widths, metal-metal separation that might otherwise create design rule check (DRC) issues are avoided by optimizing the circuit over a fine grid formed of metal/no-metal positions (pixels).

Figure 16:
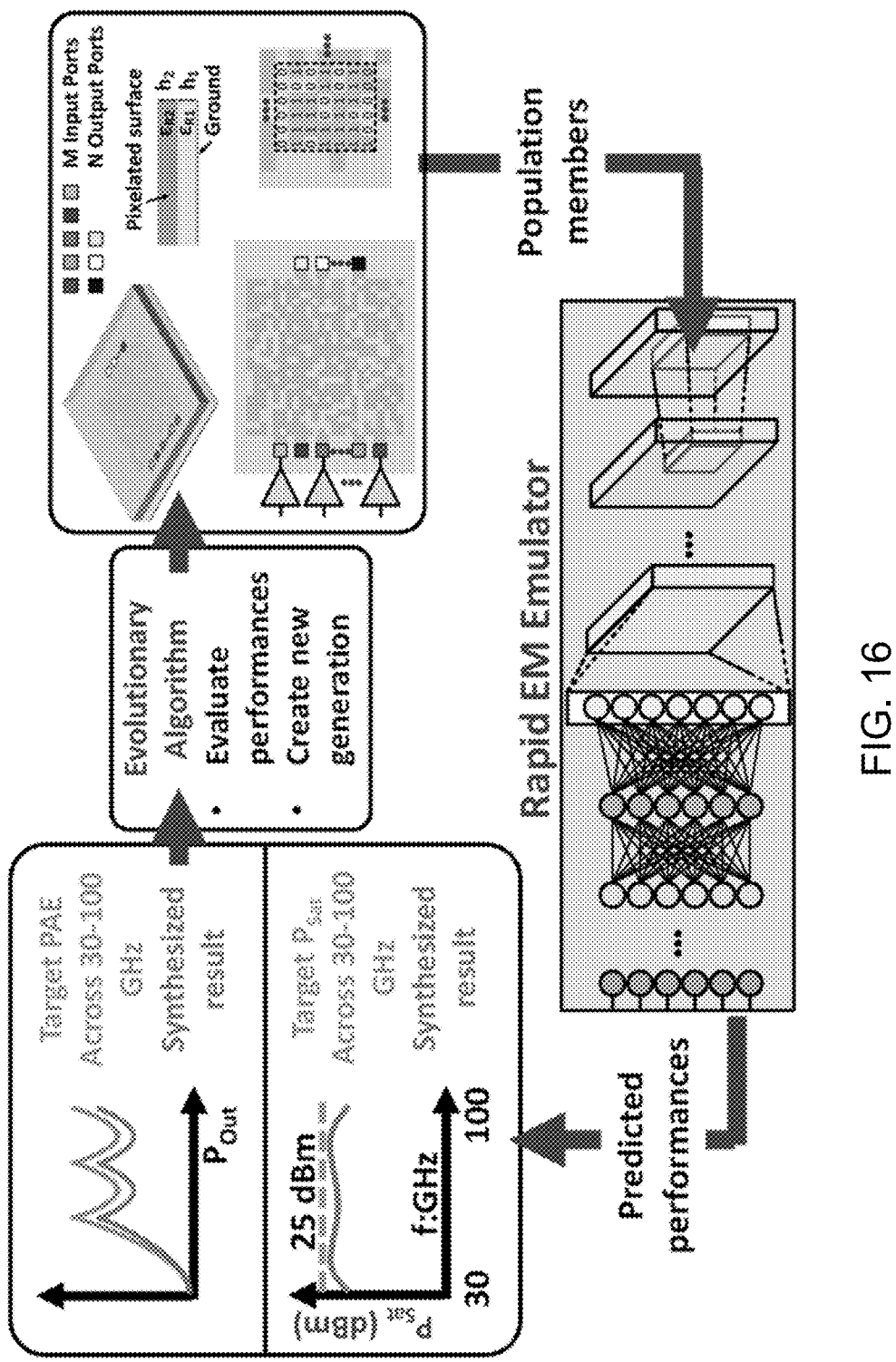
FIG. 16 graphically illustrates an optimization flow for a generalized case of a power combining network design.

FIG. 16 graphically illustrates an optimization flow for a generalized case of a power combining network design. In addition to single ended power amplifier design such as described above with respect to FIG. 6 and related figures, the embodiments are applicable to more generic case of multiple input and output circuits associated with appropriate models. For example, the various embodiments provide a matching synthesis method that is general such that not only can the regular 2 port matching networks (output matching including harmonic termination, interstage matching and input matching network) be synthesized efficiently, with enough multi-port training data available, the design flow can be generally expanded to multi-port PA combing/dividing networks (NN-ports where NN>1) with or without load modulation capability.

Figure 17:
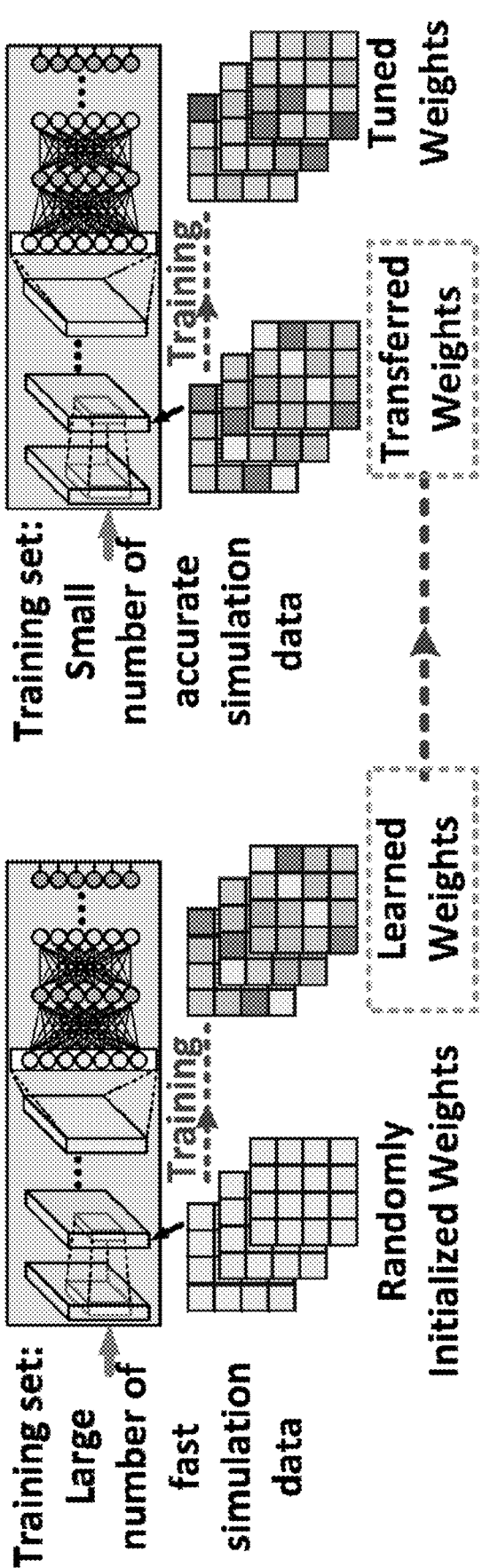
FIG. 17 graphically illustrates efficient training of a CNN transfer learning.

FIG. 17 graphically illustrates efficient training of a CNN transfer learning. Specifically, an initial model is trained using a large number of cheap simulations and the like (e.g., randomized pixelated structures). Then, the initial model is fine-tuned using more expensive but accurate simulations. Finally, geometric transformation/data augmentation is used to increase datasets associated with the CNN.

Figure 18:
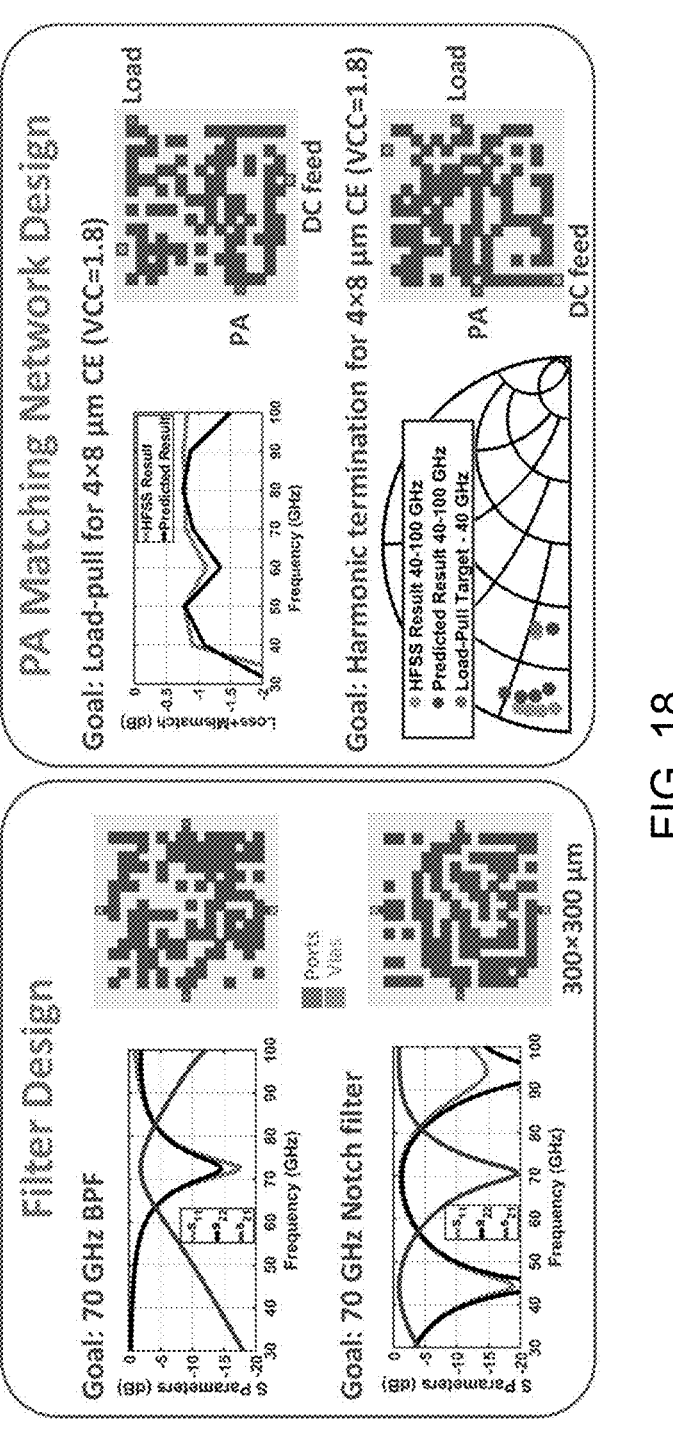
FIG. 18 graphically illustrates generalization ability of a CNN based inverse design method according to various embodiments.

FIG. 18 graphically illustrates generalization ability of a CNN based inverse design method according to the invention by showing the synthesis results for different problems such as band pass filter, notch filter, broadband load-pull matching and harmonic termination; each of which are obtained by changing the optimization targets. In particular, differing design goals such as fir different kinds of networks and/or circuits may be addressed by changing the desired specifications, such as filtering, loadpull matching, or harmonic termination, al while retaining good correlation between HFSS and neural network predicted result.

FIG. 19A depicts an exemplary realized input phase shifter and power divider circuit. FIG. 19B depicts an exemplary realized backoff efficient asymmetrical combiner network. FIG. 19C depicts an exemplary realized in phase symmetrical power combiner network.

Methods including computer implemented method for designing an impedance matching network comprise, in various embodiments: specifying an impedance matching network design goal including input impedance, backoff efficiency, and frequency range; representing a physical structure of an impedance matching network as a N×M array of pixels, wherein each pixel has a binary representation of with metal or without metal, wherein the represented physical structure of the impedance matching network further includes one or more input ports on one edge of the array and one output port on an opposite edge of the array; providing a convolutional neural network (CNN) based electromagnetic (EM) emulator to predict complex values of S-parameters over frequencies of interest of impedance matching networks represented by pixelated structures within the N×M array; optimizing, using the CNN-based EM emulator, across a design space comprising $2^{N \times M}$ possible impedance matching network representations using evolution algorithms until an impedance matching network substantially satisfying the impedance matching network design goal is reached. The optimization may use a Genetic Algorithm (GA).

A physical structure of an optimized impedance matching network may then be realized by, for example, on-chip metal layers. The realized physical structure of the optimized impedance matching network may a DC pad at an edge for simultaneous transistor DC biasing and AC short at an edge.

The matching network design goal may be associated with at least one of a two-port wideband output matching network, a two-port wideband inter-stage matching network, a two-port wideband input matching network, a three-port broadband in-phase power combiner/divider, and a three-port broadband Doherty combiner. The matching network design goal may be associated with an NN-port power combiner/divider, wherein NN is a integer greater than one.

The CNN based EM emulator may be trained in accordance with a training data set including S-parameters of randomized pixelated structures over multiple frequencies for the type of represented impedance matching network. The CNN based EM emulator may be designed by adjusting model parameters in a manner reducing test loss. The model parameter adjusting may comprise adjusting a number of convolution layers and a number of fully connected layers. The convolution layers and fully connected layers may both contain batch normalization and leaky rectified linear unit (ReLU) activation functions, the ReLU activation functions including dropout layers configured to avoid over-fitting.

The impedance matching network may be used with active discrete or on-chip devices for PA circuit synthesis.

The physical structure of the optimized integrated PA circuit may be realized as a broadband low loss output matching network having an input port and an output port, the input port connected to a power delivery node of a power transistor array, and the output port connected to a driving port of a transmit antenna. The integrated PA circuit may comprise an optimized input impedance matching network disposed between an input signal port and an input of a driver transistor array; and an optimized interstage impedance matching network disposed between an output of the driver transistor array and an input of a power transistor array. The power transistor array and driver transistor array may be realized using integrated heterojunction bipolar transistors (HBTs), field effect transistors (FETs), and/or other transistor technologies as appropriate.

The interstage network and input matching network may be realized using on-chip components comprising at least one of series microstrip lines, series on-chip Metal Insulator Metal (MIM) capacitors, microstrip open stubs, and DC feeding lines.

The interstage impedance matching network and input impedance matching network may comprise at least one of a two-port wideband output matching network, a two-port wideband inter-stage matching network, a two-port wideband input matching network, a three-port broadband in-phase power combiner/divider, and a three-port broadband Doherty combiner.

The integrated PA circuit may comprise a 2-way power combining PA, integrated PA circuit further comprising: a first branch comprising a first optimized input impedance matching network for coupling a first input signal to an input of a first driver transistor array, and a first optimized interstage impedance matching network disposed between an output of the first driver transistor array and an input of a first power transistor array; and a second branch comprising a second optimized input impedance matching network for coupling a second input signal to an input of a second driver transistor array, and a second optimized interstage impedance matching network disposed between an output of the second driver transistor array and an input of a second power transistor array. The integrated PA circuit may comprise a three-port wideband in-phase power combiner/divider. The integrated PA circuit may comprise a 2-way Doherty PA, comprising an optimized three-port broadband Doherty combiner configured for optimum load modulation across frequency at two input ports. The integrated PA circuit may comprise a class AB biased carrier PA and a class C adaptively biased peaking PA coupled to respective input ports of the Doherty combiner. The integrated PA circuit may couple a broadband quadrature hybrid signal from an PA circuit input to a first port, and provides at a first and second output ports output ports carrier PA and peaking PA respectively. The integrated PA circuit may comprise a (NN−1)-way backoff efficient power combiner PA, comprising: an inverse design optimized NN-port broadband backoff efficient combiner configured for optimum load modulation across frequency at (NN−1) input ports; each of NN−1 branches comprising a respective optimized input impedance matching network for coupling a respective input signal to an input of a respective driver transistor array, and a respective optimized interstage impedance matching network disposed between an output of the respective driver transistor array and an input of a respective power transistor array.

Various modifications may be made to the systems, methods, apparatus, mechanisms, techniques and portions thereof described herein with respect to the various figures, such modifications being contemplated as being within the scope of the invention. For example, while a specific order of steps or arrangement of functional elements is presented in the various embodiments described herein, various other orders/ arrangements of steps or functional elements may be utilized within the context of the various embodiments. Further, while modifications to embodiments may be discussed individually, various embodiments may use multiple modifications contemporaneously or in sequence, compound modifications and the like.

While specific systems, apparatus, methodologies, mechanisms and the like have been disclosed as discussed above, it should be apparent to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. In addition, the references listed herein are also part of the application and are incorporated by reference in their entirety as if fully set forth herein.

Although various embodiments which incorporate the teachings of the present invention have been shown and described in detail herein, those skilled in the art can readily devise many other varied embodiments that still incorporate these teachings. Thus, while the foregoing is directed to various embodiments of the present invention, other and further embodiments of the invention may be devised without departing from the basic scope thereof.

What is claimed is:

1. A method for designing an electromagnetic structure, comprising:
    specifying an electromagnetic structure design goal including a target electromagnetic response;
    representing a physical structure of an electromagnetic structure as an array of pixels, wherein each pixel indicates the presence or absence of conductive material, wherein the represented physical structure of the electromagnetic structure further includes one or more input ports on one edge of the array and one output port on another edge of the array;
    providing a neural network (NN) based electromagnetic (EM) emulator configured to predict scattering parameters of electromagnetic structures represented by the array of pixels over frequencies of interest;
    optimizing, using the NN-based EM emulator, across a multi-dimensional design space of possible electromagnetic structure representations using evolution algorithms until an electromagnetic structure substantially satisfying the electromagnetic structure design goal is reached.

2. The method of claim 1, further comprising realizing the physical structure of an optimized electromagnetic structure via on-chip metal layers.

3. The method of claim 2, wherein the realized physical structure of the optimized electromagnetic structure includes a DC pad at an edge for simultaneous transistor DC biasing and AC short at an edge.

4. The method of claim 1, wherein the electromagnetic structure design goal is associated with at least one of a two-port wideband output matching network, a two-port wideband inter-stage matching network, a two-port wideband input matching network, a three-port broadband in-phase power combiner/divider, and a three-port broadband Doherty combiner.

5. The method of claim 1, wherein the electromagnetic structure design goal is associated with an NN-port power combiner/divider, wherein NN is a integer greater than one.

6. The method of claim 1, wherein the CNN based EM emulator is trained in accordance with a training data set including scattering parameters of randomized pixelated structures over multiple frequencies for the type of represented electromagnetic structure.

7. The method of claim 6, wherein the CNN based EM emulator is designed by adjusting model parameters in a manner reducing test loss.

8. The method of claim 7, wherein the model parameter adjusting comprises adjusting a number of convolution layers and a number of fully connected layers.

9. The method of claim 8, wherein the convolution layers and fully connected layers both contain batch normalization and leaky rectified linear unit (ReLU) activation functions, the ReLU activation functions including dropout layers configured to avoid over-fitting.

10. The method of claim 1 wherein the optimization uses a Genetic Algorithm (GA).

11. The method of claim 10, wherein the integrated PA circuit comprises a (NN−1)-way backoff efficient power combiner PA, comprising:
    an inverse design optimized NN-port broadband backoff efficient combiner configured for optimum load modulation across frequency at (NN−1) input ports;
    each of NN−1 branches comprising a respective optimized input electromagnetic structure for coupling a respective input signal to an input of a respective driver transistor array, and a respective optimized interstage electromagnetic structure disposed between an output of the respective driver transistor array and an input of a respective power transistor array.

12. The method of claim 1, wherein the electromagnetic structure comprises an impedance matching network used with active discrete or on-chip devices for power amplifier (PA) circuit synthesis.

13. The method of claim 12, further comprising realizing the physical structure of the optimized integrated PA circuit as a broadband low loss output matching network having an input port and an output port, the input port connected to a power delivery node of a power transistor array, and the output port connected to a driving port of a transmit antenna.

14. The method of claim 13, wherein the integrated PA circuit further comprises:
    an optimized input impedance matching network disposed between an input signal port and an input of a driver transistor array; and
    an optimized interstage impedance matching network disposed between an output of the driver transistor array and an input of a power transistor array.

15. The method of claim 14, wherein the power transistor array and driver transistor array are realized using integrated heterojunction bipolar transistors (HBTs).

16. The method of claim 14, wherein the interstage electromagnetic structure and input electromagnetic structure comprise at least one of a two-port wideband output matching network, a two-port wideband inter-stage matching network, a two-port wideband input matching network, a three-port broadband in-phase power combiner/divider, and a three-port broadband Doherty combiner.

17. The method of claim 13, wherein:

the interstage impedance matching network and input impedance matching network are realized using on-chip components comprising at least one of series microstrip lines, series on-chip Metal Insulator Metal (MIM) capacitors, microstrip open stubs, and DC feeding lines.

18. The method of claim 17, wherein the integrated PA circuit couples a broadband quadrature hybrid signal from an PA circuit input to a first port, and provides at first and second output ports carrier PA and peaking PA respectively.

19. The method of claim 13, wherein the integrated PA circuit comprises a 2-way power combining PA, integrated PA circuit further comprising:

a first branch comprising a first optimized input electromagnetic structure for coupling a first input signal to an input of a first driver transistor array, and a first optimized interstage electromagnetic structure disposed between an output of the first driver transistor array and an input of a first power transistor array; and a second branch comprising a second optimized input electromagnetic structure for coupling a second input signal to an input of a second driver transistor array, and a second optimized interstage electromagnetic structure disposed between an output of the second driver transistor array and an input of a second power transistor array.

20. The method of claim 19, wherein the integrated PA circuit comprises a three-port wideband in-phase power combiner/divider.

21. The method of claim 20, wherein the integrated PA circuit comprises a 2-way Doherty PA, comprising an optimized three-port broadband Doherty combiner configured for optimum load modulation across frequency at two input ports.

22. The method of claim 21, wherein the integrated PA circuit comprises a class AB biased carrier PA and a class C adaptively biased peaking PA coupled to respective input ports of the Doherty combiner.

23. A computer implemented method for designing an electromagnetic structure, comprising:

specifying an electromagnetic structure design goal including a target electromagnetic response;

specifying an electromagnetic structure design goal including a target electromagnetic response;

representing a physical structure of an electromagnetic structure as an array of pixels, wherein each pixel indicates the presence or absence of conductive material, wherein the represented physical structure of the electromagnetic structure further includes one or more input ports on one edge of the array and one output port on another edge of the array;

providing a neural network (NN) based electromagnetic (EM) emulator configured to predict scattering parameters of electromagnetic structures represented by the array of pixels over frequencies of interest;

optimizing, using the NN-based EM emulator, across a multi-dimensional design space of possible electromagnetic structure representations using evolution algorithms until an electromagnetic structure substantially satisfying the electromagnetic structure design goal is reached.

*    *    *    *    *